United States Patent
Pi et al.

(10) Patent No.: US 11,610,940 B2
(45) Date of Patent: Mar. 21, 2023

(54) MAGNETIC MEMORY DEVICES HAVING A FIRST MAGNETIC PATTERN AND MULTIPLE SECOND MAGNETIC PATTERNS THEREON

(71) Applicant: Samsung Electronics Co., Ltd., Suwon-si (KR)

(72) Inventors: Ung Hwan Pi, Hwaseong-si (KR); Dongkyu Lee, Suwon-si (KR)

(73) Assignee: Samsung Electronics Co., Ltd.

( * ) Notice: Subject to any disclaimer, the term of this patent is extended or adjusted under 35 U.S.C. 154(b) by 233 days.

(21) Appl. No.: 16/897,810

(22) Filed: Jun. 10, 2020

(65) Prior Publication Data

US 2021/0043681 A1   Feb. 11, 2021

(30) Foreign Application Priority Data

Aug. 9, 2019 (KR) .................. 10-2019-0097278

(51) Int. Cl.
| | | |
|---|---|---|
| *H01L 27/22* | (2006.01) | |
| *H01L 23/528* | (2006.01) | |
| *H01F 10/32* | (2006.01) | |
| *G11C 11/16* | (2006.01) | |
| *H01L 43/02* | (2006.01) | |

(52) U.S. Cl.
CPC .......... *H01L 27/222* (2013.01); *G11C 11/161* (2013.01); *H01F 10/329* (2013.01); *H01F 10/3254* (2013.01); *H01L 23/528* (2013.01); *H01L 43/02* (2013.01)

(58) Field of Classification Search
CPC ..... H01L 27/222; H01L 23/528; H01L 43/02; G11C 11/161; H01F 10/3254; H01F 10/329
See application file for complete search history.

(56) References Cited

U.S. PATENT DOCUMENTS

| | | |
|---|---|---|
| 7,952,905 B2 | 5/2011 | Hwang et al. |
| 7,957,175 B2 | 6/2011 | Lim et al. |
| 8,009,453 B2 | 8/2011 | Gaidis et al. |
| 8,023,305 B2 | 9/2011 | Gaidis et al. |
| 8,254,164 B2 | 8/2012 | Lee et al. |
| 8,339,728 B2 | 12/2012 | Kim et al. |
| 8,681,542 B2 | 3/2014 | Hwang |
| 8,741,664 B2 | 6/2014 | Annunziata et al. |
| 8,772,889 B2 | 7/2014 | Gaidis et al. |
| 9,214,213 B2 | 12/2015 | Nakamura et al. |
| 9,230,625 B2 | 1/2016 | Inokuchi et al. |
| 10,008,350 B2 | 6/2018 | Quinsat et al. |
| 2009/0316475 A1* | 12/2009 | Lee .................. G11C 11/1655 257/E43.001 |
| 2018/0358557 A1 | 12/2018 | Jung |

FOREIGN PATENT DOCUMENTS

KR   10-2012-0027184 A   3/2012

* cited by examiner

*Primary Examiner* — Samuel A Gebremariam
(74) *Attorney, Agent, or Firm* — Myers Bigel, P.A.

(57) ABSTRACT

Disclosed is a magnetic memory device including a first magnetic pattern that extends in a first direction and has a magnetization direction fixed in one direction, and a plurality of second magnetic patterns that extend across the first magnetic pattern. The second magnetic patterns extend in a second direction intersecting the first direction and are spaced apart from each other in the first direction. Each of the second magnetic patterns includes a plurality of magnetic domains that are spaced apart from each other in the second direction.

20 Claims, 31 Drawing Sheets

MAGNETIC MEMORY DEVICES HAVING A FIRST MAGNETIC PATTERN AND MULTIPLE SECOND MAGNETIC PATTERNS THEREON

CROSS-REFERENCE TO RELATED APPLICATION

This U.S. non-provisional application claims priority under 35 U.S.C § 119 to Korean Patent Application No. 10-2019-0097278, filed on Aug. 9, 2019, in the Korean Intellectual Property Office, the disclosure of which is hereby incorporated by reference in its entirety.

BACKGROUND

The present disclosure relates to magnetic memory devices and, more particularly, to magnetic memory devices that use motion of magnetic domain walls. As electronic devices trend toward higher speed and lower power consumption, high-speed read/write operations and low operating voltages may also be required for memory devices incorporated therein. To meet these requirements, magnetic memory devices have been developed as memory devices. Since the magnetic memory device operates at high speed and has nonvolatile characteristics, it has attracted considerable attention as a next-generation memory device. In particular, new magnetic memory devices have recently been studied and developed to use motion of magnetic domain walls in magnetic materials.

SUMMARY

Some example embodiments of the present inventive concepts provide a magnetic memory device that can be highly integrated.

Some example embodiments of the present inventive concepts provide a magnetic memory device that can be easily mass-fabricated.

According to some example embodiments of the present inventive concepts, a magnetic memory device may comprise: a first magnetic pattern that extends in a first direction and has a magnetization direction fixed in one direction; and a plurality of second magnetic patterns that extend across the first magnetic pattern. The plurality of second magnetic patterns may extend in a second direction intersecting the first direction and may be spaced apart from each other in the first direction. Each of the plurality of second magnetic patterns may include a plurality of magnetic domains that are spaced apart from each other in the second direction.

According to some example embodiments of the present inventive concepts, a magnetic memory device may comprise: a conductive line that extends in a first direction on a substrate; a first magnetic pattern that is on the conductive line and extends in the first direction; and a plurality of second magnetic patterns that are on the first magnetic pattern and extend across the first magnetic pattern. The plurality of second magnetic patterns may extend in a second direction intersecting the first direction and may be spaced apart from each other in the first direction. Each of the plurality of second magnetic patterns may include a plurality of magnetic domains that are spaced apart from each other in the second direction.

According to some example embodiments of the present inventive concepts, a magnetic memory device may comprise: a first magnetic pattern; and a plurality of second magnetic patterns that extend across the first magnetic pattern. Each of the plurality of second magnetic patterns may include a plurality of magnetic domains that are spaced apart from each other in one direction. The first magnetic pattern may be electrically connected to each of the plurality of second magnetic patterns.

DETAILED DESCRIPTION

The following will now describe in detail some example embodiments of the present inventive concepts with reference to the accompanying drawings.

Figure 1:
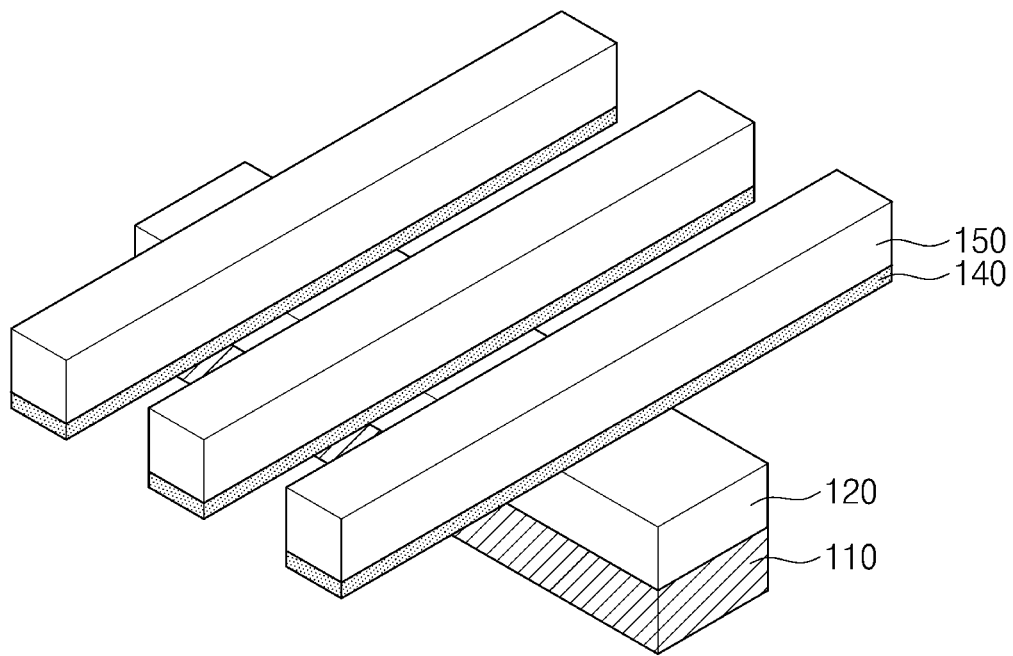
FIG. 1 illustrates a simplified perspective view showing a magnetic memory device according to some example embodiments of the present inventive concepts.

FIG. 1 illustrates a simplified perspective view showing a magnetic memory device according to some example embodiments of the present inventive concepts.

Referring to FIG. 1, a conductive line 110 may extend (i.e., extend primarily/longitudinally) in a first direction D1. The conductive line 110 may be provided thereon with a first magnetic pattern 120 that extends in the first direction D1. A plurality of second magnetic patterns 150 may be disposed on the first magnetic pattern 120, while running (i.e., extending) across the first magnetic pattern 120. The plurality of second magnetic patterns 150 may extend in a second direction D2 intersecting (e.g., perpendicular to) the first direction D1 and may be spaced apart from each other along the first direction D1. The plurality of second magnetic patterns 150 may be spaced apart from the conductive line 110 along a third direction D3 perpendicular to the first and second directions D1 and D2. The first magnetic pattern 120 may be disposed between the conductive line 110 and the plurality of second magnetic patterns 150. The first magnetic pattern 120 and the conductive line 110 may extend parallel to each other along the first direction D1 and may run across the plurality of second magnetic patterns 150.

A plurality of tunnel barrier patterns 140 may be interposed between the first magnetic pattern 120 and the plurality of second magnetic patterns 150. The plurality of tunnel barrier patterns 140 may extend in the second direction D2 and may be spaced apart from each other along the first direction D1. Each of the plurality of tunnel barrier patterns 140 may be interposed between the first magnetic pattern 120 and a corresponding (i.e., respective) one of the plurality of second magnetic patterns 150.

Figure 2:
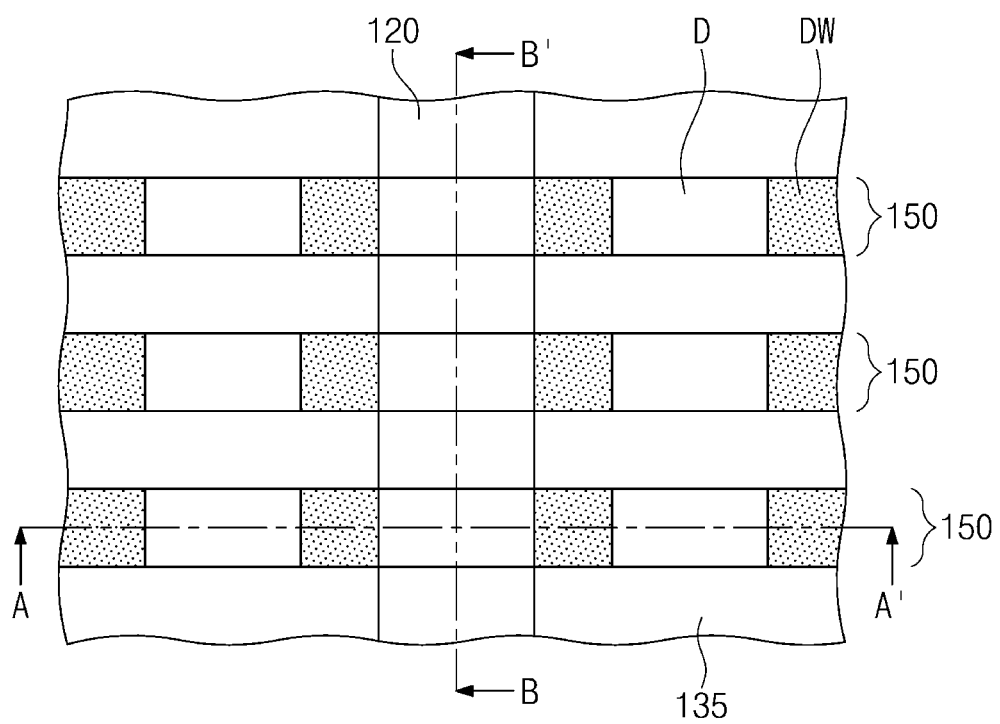
FIG. 2 illustrates a plan view showing a magnetic memory device according to some example embodiments of the present inventive concepts.
Figure 2:
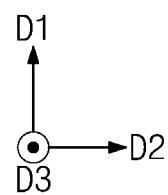
Figure 3A:
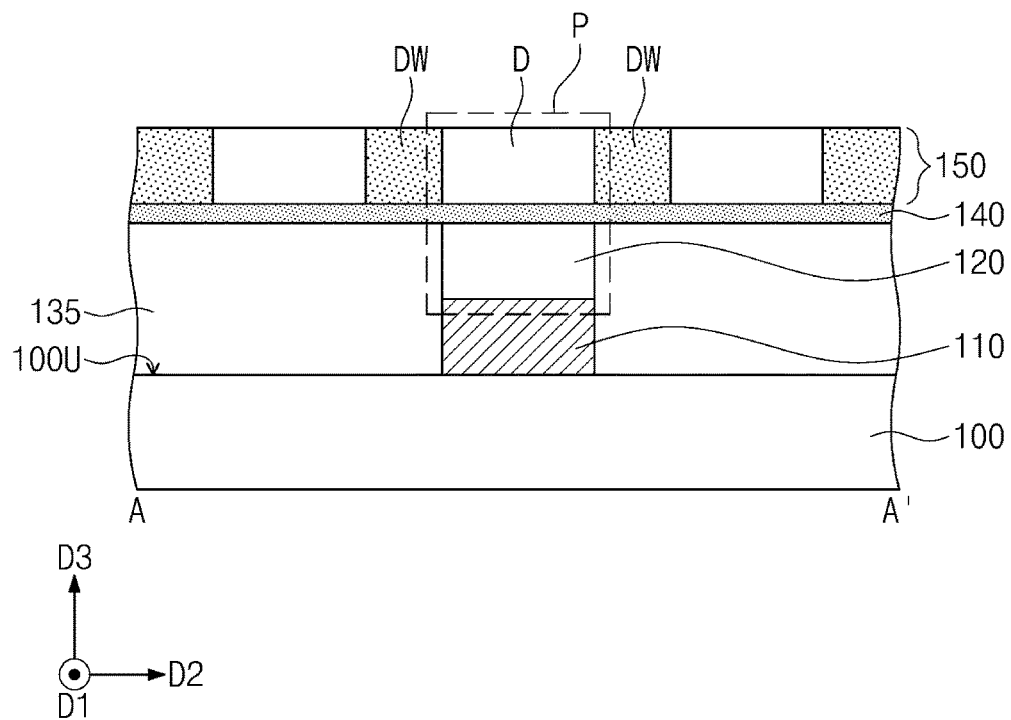
FIG. 3A illustrates a cross-sectional view taken along line A-A' of FIG. 2.
Figure 3B:
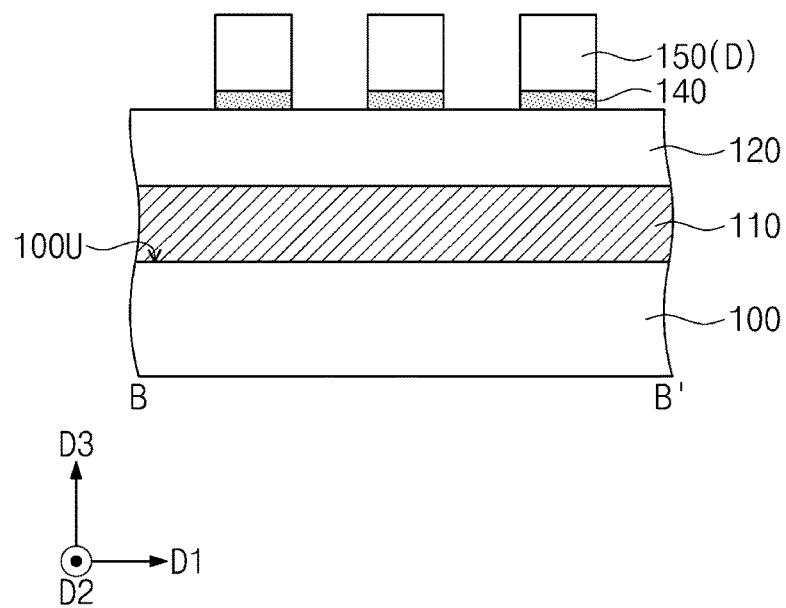
FIG. 3B illustrates a cross-sectional view taken along line B-B' of FIG. 2.
Figure 3C:
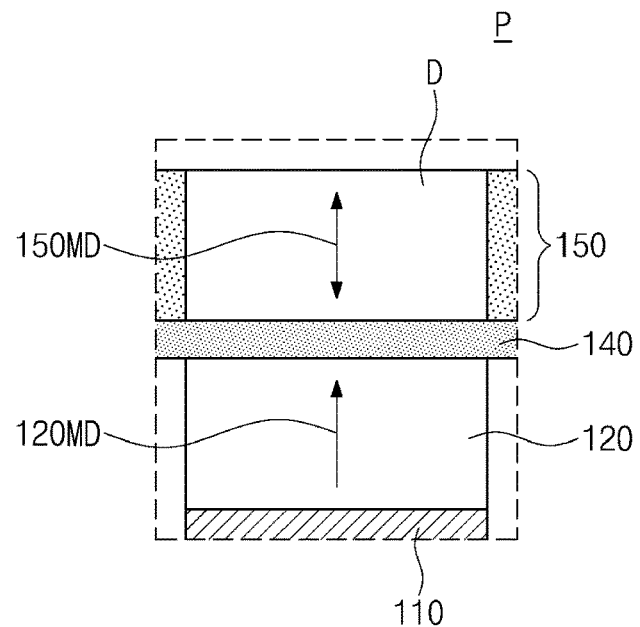
FIGS. 3C and 3D illustrate enlarged views showing section P of FIG. 3A.
Figure 3D:
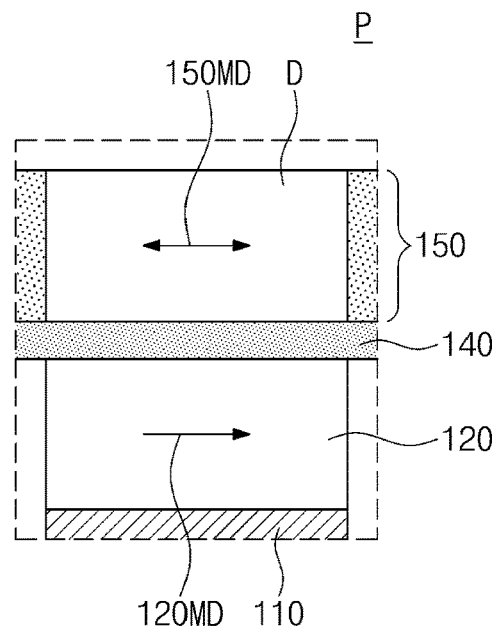

FIG. 2 illustrates a plan view showing a magnetic memory device according to some example embodiments of the present inventive concepts. FIG. 3A illustrates a cross-sectional view taken along line A-A' of FIG. 2. FIG. 3B illustrates a cross-sectional view taken along line B-B' of FIG. 2. FIGS. 3C and 3D illustrate enlarged views showing section P of FIG. 3A.

Referring to FIGS. 2, 3A, and 3B, a substrate 100 may be provided thereon with a conductive line 110 that extends in a first direction D1 parallel to a top surface 100U of the substrate 100. The conductive line 110 may include one or more of metal (e.g., copper, tungsten, or aluminum) and metal nitride (e.g., tantalum nitride, titanium nitride, or tungsten nitride).

A first magnetic pattern 120 may extend in the first direction D1 on the conductive line 110. The conductive line 110 may be disposed between the substrate 100 and the first magnetic pattern 120. The first magnetic pattern 120 and the conductive line 110 may extend parallel to each other along the first direction D1. The first magnetic pattern 120 may include one or more of cobalt (Co), iron (Fe), and nickel (Ni).

An interlayer dielectric layer 135 may be disposed on the substrate 100, on (e.g., covering) the conductive line 110 and the first magnetic pattern 120. The interlayer dielectric layer 135 may cover a lateral surface of the conductive line 110 and a lateral surface of the first magnetic pattern 120. The first magnetic pattern 120 may have a top surface substantially coplanar with that of the interlayer dielectric layer 135. The interlayer dielectric layer 135 may include, for example, one or more of silicon oxide, silicon nitride, and silicon oxynitride.

The interlayer dielectric layer 135 may be provided thereon with a plurality of second magnetic patterns 150 that run across the first magnetic pattern 120. The plurality of second magnetic patterns 150 may extend in a second direction D2 intersecting the first direction D1 and may be spaced apart from each other along the first direction D1. The first and second directions D1 and D2 may be parallel to the top surface 100U of the substrate 100. The plurality of second magnetic patterns 150 may be spaced apart from the conductive line 110 along a third direction D3 perpendicular to the top surface 100U of the substrate 100, and the first magnetic pattern 120 may be disposed between the conductive line 110 and the plurality of second magnetic patterns 150. The first magnetic pattern 120 may vertically overlap the conductive line 110 along the third direction D3 and may extend parallel to the conductive line 110 along the first direction D1. The first magnetic pattern 120 and the conductive line 110 may run across the plurality of second magnetic patterns 150.

Each of the plurality of second magnetic patterns 150 may include a plurality of magnetic domains D and a plurality of magnetic domain walls DW. In each of the plurality of second magnetic patterns 150, the plurality of magnetic domains D and the plurality of magnetic domain walls DW may be arranged alternately and repeatedly along the second direction D2. The magnetic domains D may be regions in which magnetization directions are uniform in a magnetic substance (e.g., in each of the second magnetic patterns 150), and the plurality of magnetic domain walls DW may be regions where magnetization directions are changed between the plurality of magnetic domains D in the magnetic substance. Each of the plurality of magnetic domain walls DW may define a boundary between the magnetic domains D that have different magnetization directions. Sizes and magnetization directions of the magnetic domains D may be appropriately controlled by external energy and a shape and size of the magnetic substance. The magnetic domain walls DW may move by current or magnetic field applied to the magnetic substance. Each of the plurality of second magnetic patterns 150 may include one or more of cobalt (Co), iron (Fe), and nickel (Ni).

A plurality of tunnel barrier patterns 140 may be interposed between the first magnetic pattern 120 and the plurality of second magnetic patterns 150. The plurality of tunnel barrier patterns 140 may extend in the second direction D2 and may be spaced apart from each other along the first direction D1. Each of the plurality of tunnel barrier patterns 140 may be interposed between the first magnetic pattern 120 and a corresponding one of the plurality of second magnetic patterns 150, and may extend between the corresponding second magnetic pattern 150 and the interlayer dielectric layer 135. Each of the plurality of tunnel barrier patterns 140 may include one or more of a magnesium (Mg) oxide layer, a titanium (Ti) oxide layer, an aluminum (Al) oxide layer, a magnesium-zinc (Mg—Zn) oxide layer, and a magnesium-boron (Mg—B) oxide layer.

Referring to FIGS. 3C and 3D, the first magnetic pattern 120 may be a reference layer whose magnetization direction 120MD is fixed in one direction, and each of the second magnetic patterns 150 may be a free layer whose magnetization direction 150MD is switchable. Each of the magnetic domains D may have the magnetization direction 150MD capable of being oriented parallel or antiparallel to the magnetization direction 120MD of the first magnetic pattern 120. For example, as shown in FIG. 3C, the magnetization direction 120MD of the first magnetic pattern 120 and the magnetization direction 150MD of each of the magnetic domains D may be perpendicular to an interface between the first magnetic pattern 120 and each of the tunnel barrier patterns 140. In this case, each of the first and second magnetic patterns 120 and 150 may include one or more of a perpendicular magnetic material (e.g., CoFeTb, CoFeGd, or CoFeDy), a perpendicular magnetic material having an L10 structure, CoPt of a hexagonal close packed (HCP) lattice structure, and a perpendicular magnetization structure. The perpendicular magnetic material having the L10 structure may include one or more of FePt of the L10 structure, FePd of the L10 structure, CoPd of the L10 structure, and CoPt of the L10 structure. The perpendicular magnetization structure may include magnetic layers and non-magnetic layers that are alternately and repeatedly stacked. For example, the perpendicular magnetization structure may include one or more of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where, n is the stack number). For another example, as shown in FIG. 3D, the magnetization direction 120MD of the first magnetic pattern 120 and the magnetization direction 150MD of each of the magnetic domains D may be parallel to an interface between the first magnetic pattern 120 and each of the tunnel barrier patterns 140. In this case, each of the first and second magnetic patterns 120 and 150 may include a ferromagnetic material, and the first magnetic pattern 120 may further include an anti-ferromagnetic material that fixes a magnetization direction of the ferromagnetic material.

Referring back to FIGS. 2, 3A, and 3B, the first magnetic pattern 120 may extend in the first direction D1 and may be connected in common to (e.g., electrically connected to each of) the plurality of second magnetic patterns 150. The first magnetic pattern 120 may extend from a first location between the conductive line 110 and one of the plurality of second magnetic patterns 150 toward (and/or to) a second location between the conductive line 110 and another of the plurality of second magnetic patterns 150.

Figure 4A:
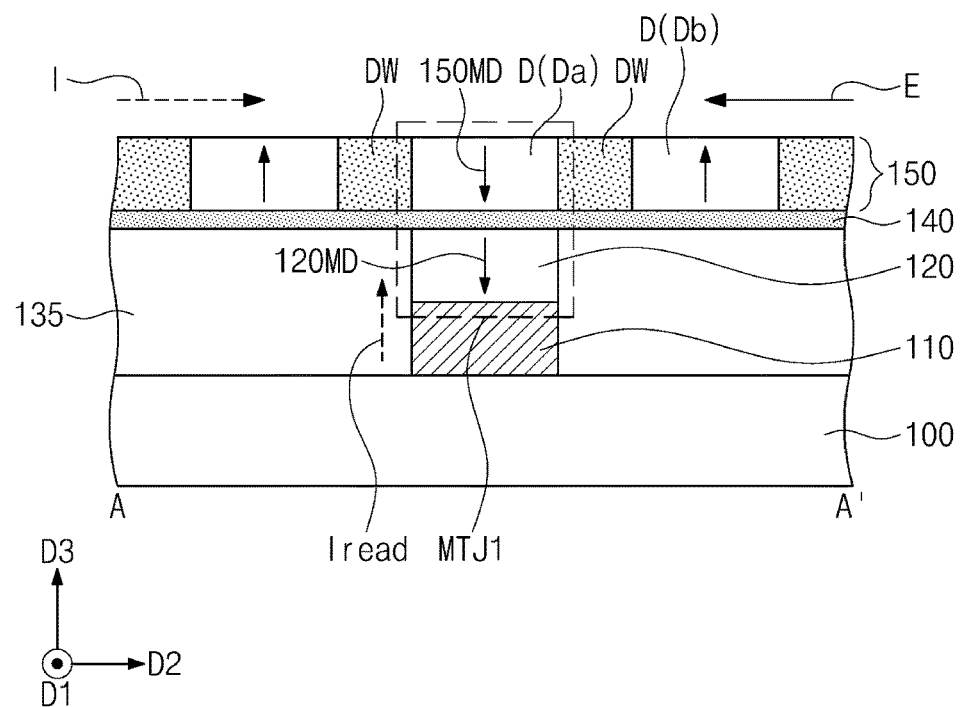
FIGS. 4A, 4B, 5A, and 5B illustrate conceptual views showing a read operation of a magnetic memory device according to some example embodiments of the present inventive concepts.
Figure 4B:
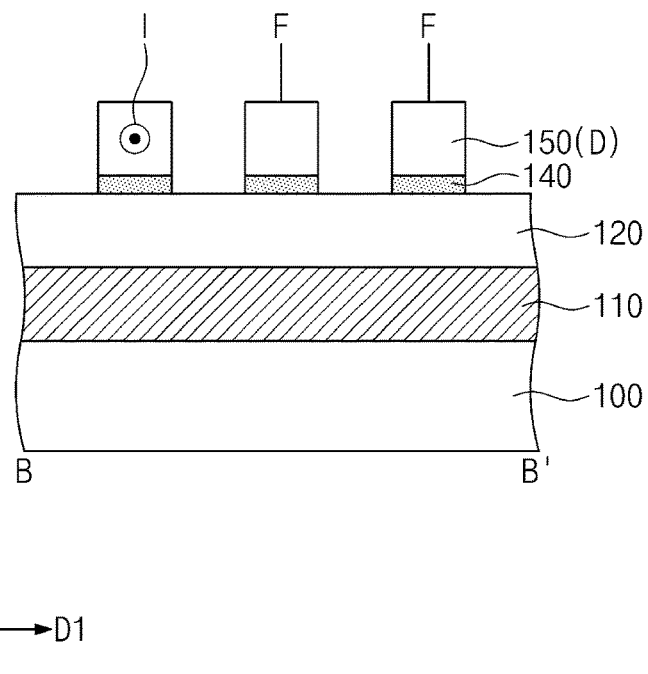
Figure 5A:
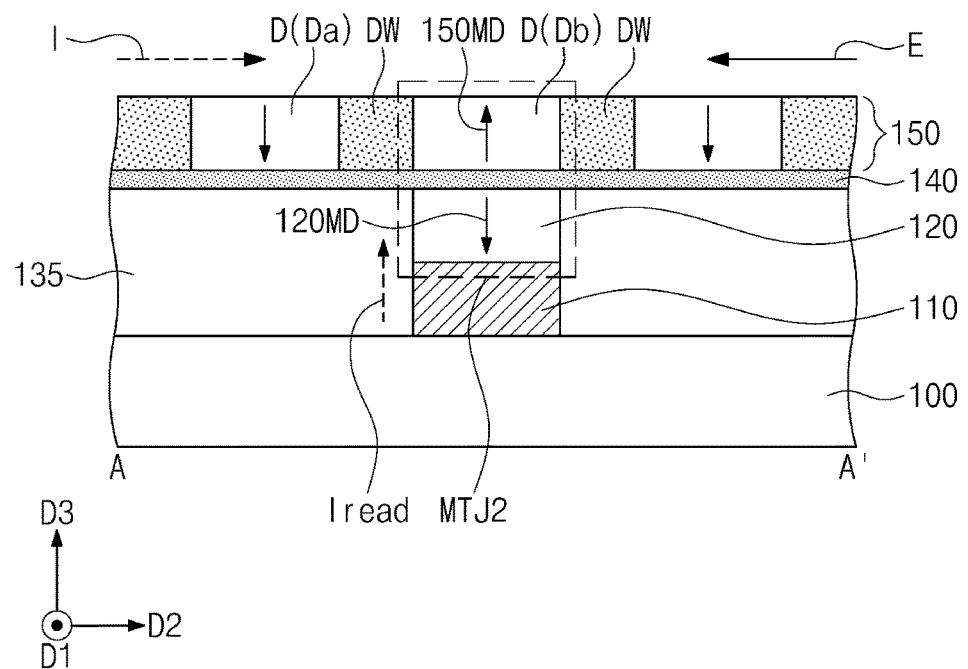
Figure 5B:
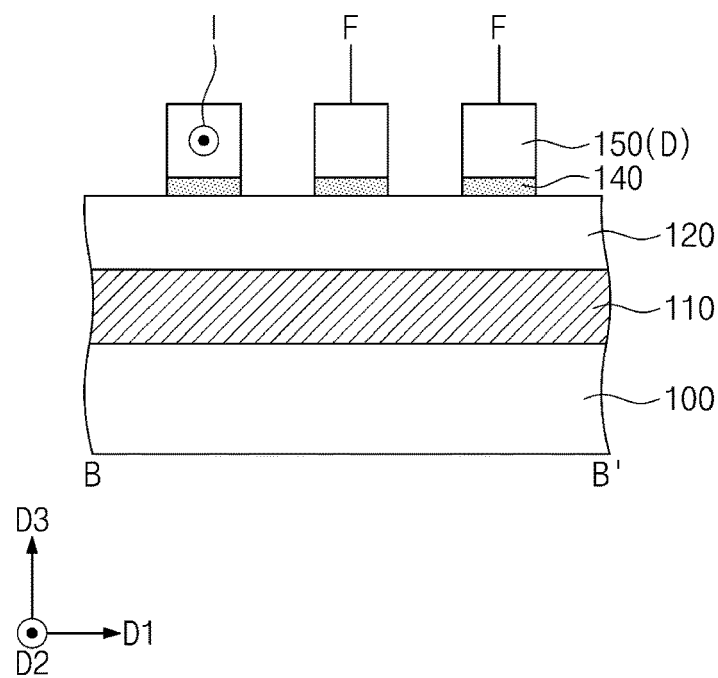

FIGS. 4A, 4B, 5A, and 5B illustrate conceptual views showing a read operation of a magnetic memory device according to some example embodiments of the present inventive concepts. FIGS. 4A and 5A illustrate cross-sectional views taken along line A-A' of FIG. 2. FIGS. 4B and 5B illustrate cross-sectional views taken along line B-B' of FIG. 2. For brevity of description, an example case is explained in which the magnetization directions 120MD and 150MD are perpendicular to an interface between the first magnetic pattern 120 and each of the tunnel barrier patterns 140, but the present inventive concepts are not limited thereto. Even when the magnetization directions 120MD and 150MD are parallel to the interface between the first magnetic pattern 120 and each of the tunnel barrier patterns 140, a magnetic memory device may perform a read operation as follows.

Referring to FIGS. 2, 4A, and 4B, a current I to move the magnetic domain walls DW may flow through one of the plurality of second magnetic patterns 150. The rest of the plurality of second magnetic patterns 150 may be held in an electrical floating state F. A direction of the current I may determine moving directions of the magnetic domain walls DW in the one of the plurality of second magnetic patterns 150. The magnetic domain walls DW may move along a moving direction of electrons E, and thus the magnetic domain walls DW may move in a direction opposite to that of the current I. For example, the current I may flow in the second direction D2, but the magnetic domain walls DW may move in a direction opposite to the second direction D2.

In the one of the plurality of second magnetic patterns 150, the magnetization direction 150MD of each of the magnetic domains D may be parallel or antiparallel to the magnetization direction 120MD of the first magnetic pattern 120. The magnetic domains D may include a first magnetic domain Da and a second magnetic domain Db that neighbor each other across a corresponding one of the magnetic domain walls DW. The magnetization direction 150MD of the first magnetic domain Da may be opposite to the magnetization direction 150MD of the second magnetic domain Db. When the current I flows through the one of the plurality of second magnetic patterns 150, the motion of the magnetic domain walls DW may allow the first magnetic domain Da to align with the first magnetic pattern 120. The first magnetic pattern 120 and the first magnetic domain Da may constitute a first magnetic tunnel junction MTJ1.

A read current Iread may flow through the first magnetic tunnel junction MTJ1. The read current Iread may flow from the first magnetic pattern 120 toward the first magnetic domain Da along a direction (e.g., the third direction D3) perpendicular to an interface between the first magnetic pattern 120 and a corresponding one of the plurality of tunnel barrier patterns 140. The read current Iread may detect a resistance state of the first magnetic tunnel junction MTJ1. The read current Iread may detect whether the first magnetic tunnel junction MTJ1 is either in a high-resistance state or in a low-resistance state. For example, the magnetization direction 150MD of the first magnetic domain Da may be parallel to the magnetization direction 120MD of the first magnetic pattern 120 and, in this case, the first magnetic tunnel junction MTJ1 may be in a low-resistance state. A data (e.g., a logic state of 0 or 1) stored in the first magnetic domain Da may be detected from the resistance state of the first magnetic tunnel junction MTJ1.

Thereafter, referring to FIGS. 2, 5A, and 5B, the current I may flow again through the one of the plurality of second magnetic patterns 150. The rest of the plurality of second magnetic patterns 150 may be held in an electrical floating state F. When the current I flows through the one of the plurality of second magnetic patterns 150, the motion of the magnetic domain walls DW may allow the second magnetic domain Db to align with the first magnetic pattern 120. The first magnetic pattern 120 and the second magnetic domain Db may constitute a second magnetic tunnel junction MTJ2.

The read current Iread may flow through the second magnetic tunnel junction MTJ2. The read current Iread may flow from the first magnetic pattern 120 toward the second magnetic domain Db along a direction (e.g., the third direction D3) perpendicular to an interface between the first magnetic pattern 120 and a corresponding one of the plurality of tunnel barrier patterns 140. The read current Iread may detect a resistance state of the second magnetic tunnel junction MTJ2. The read current Iread may detect whether the second magnetic tunnel junction MTJ2 is either in a high-resistance state or in a low-resistance state. For example, the magnetization direction 150MD of the second magnetic domain Db may be antiparallel to the magnetization direction 120MD of the first magnetic pattern 120 and, in this case, the second magnetic tunnel junction MTJ2 may be in a high-resistance state. A data (e.g., a logic state of 1 or 0) stored in the second magnetic domain Db may be detected from the resistance state of the second magnetic tunnel junction MTJ2.

According to some embodiments of the present inventive concepts, the first magnetic pattern 120 may run across the plurality of second magnetic patterns 150 and also may be connected in common to the plurality of second magnetic patterns 150. In this case, the read operation mentioned above may be sequentially and individually performed on the plurality of second magnetic patterns 150.

Figure 6A:
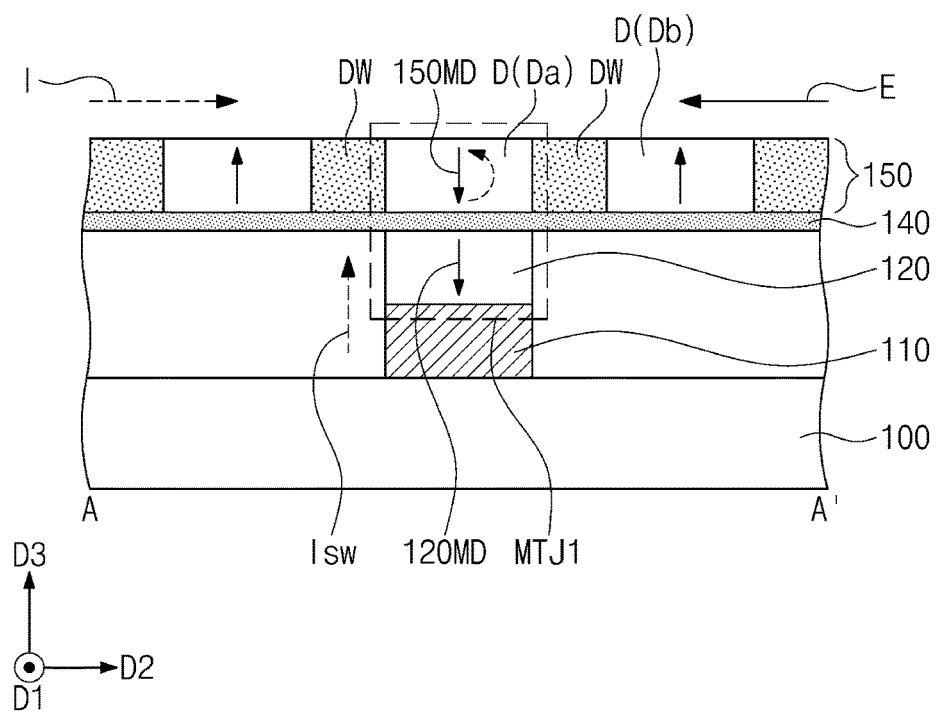
FIGS. 6A, 6B, 7A, and 7B illustrate conceptual views showing a write operation of a magnetic memory device according to some example embodiments of the present inventive concepts.
Figure 6B:
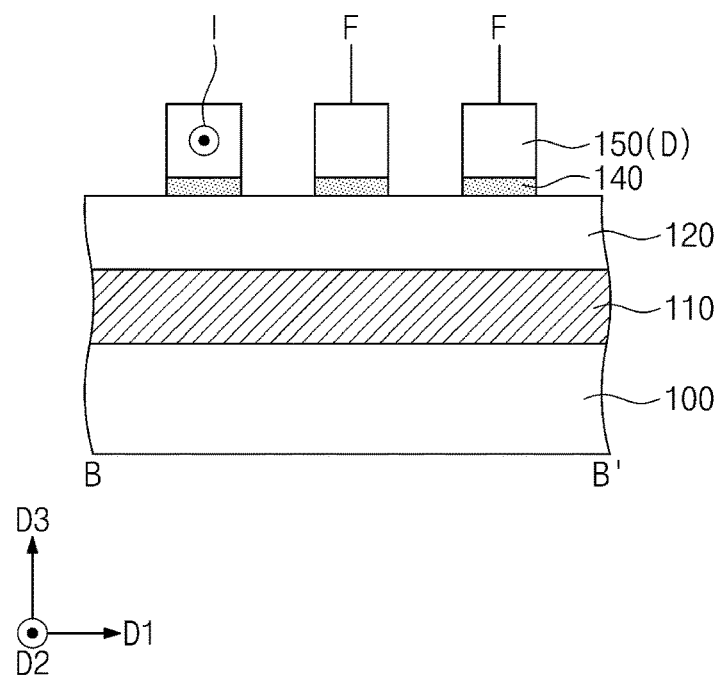
Figure 7A:
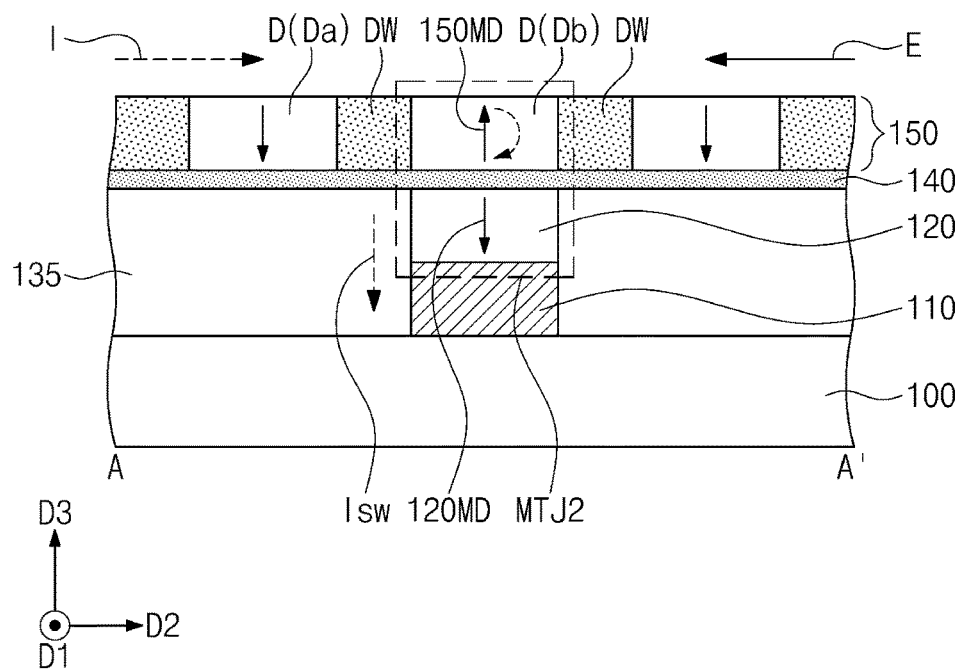
Figure 7B:
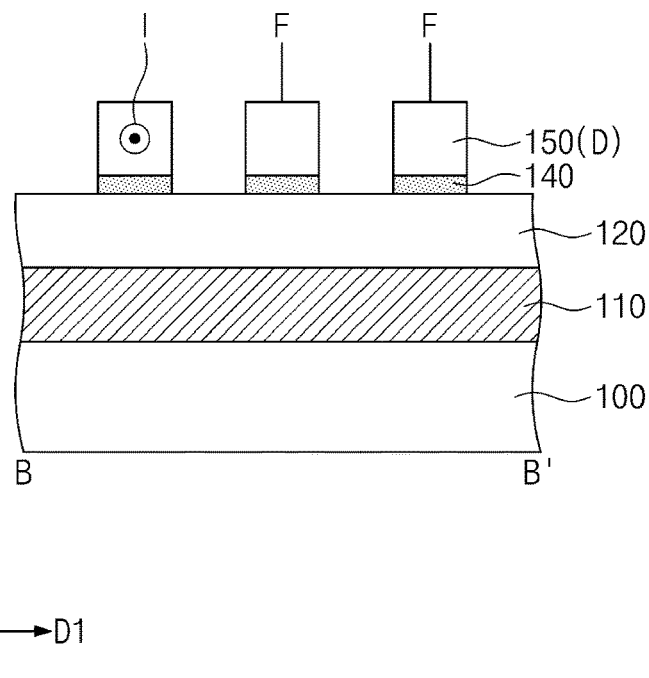

FIGS. 6A, 6B, 7A, and 7B illustrate conceptual views showing a write operation of a magnetic memory device according to some example embodiments of the present inventive concepts. FIGS. 6A and 7A illustrate cross-sectional views taken along line A-A' of FIG. 2. FIGS. 6B and 7B illustrate cross-sectional views taken along line B-B' of FIG. 2. For brevity of description, an example case will be explained below where the magnetization directions 120MD and 150MD are perpendicular to an interface between the first magnetic pattern 120 and each of the tunnel barrier patterns 140, but the present inventive concepts are not limited thereto. Even when the magnetization directions 120MD and 150MD are parallel to an interface between the first magnetic pattern 120 and each of the tunnel barrier patterns 140, a magnetic memory device may perform a write operation as follows.

Referring to FIGS. 2, 6A, and 6B, the current I to move the magnetic domain walls DW may flow through one of the plurality of second magnetic patterns 150. The rest of the plurality of second magnetic patterns 150 may be held in an electrical floating state F. For example, the current I may flow in the second direction D2, and the magnetic domain walls DW may move in a direction (e.g., a moving direction of electrons E) opposite to the second direction D2. When the current I flows through the one of the plurality of second magnetic patterns 150, the motion of the magnetic domain walls DW may allow the first magnetic domain Da to align with the first magnetic pattern 120. The first magnetic pattern 120 and the first magnetic domain Da may constitute the first magnetic tunnel junction MTJ1. For example, the magnetization direction 150MD of the first magnetic domain Da may be parallel to the magnetization direction 120MD of the first magnetic pattern 120.

A write current Isw may flow through the first magnetic tunnel junction MTJ1. The write current Isw may flow from the first magnetic pattern 120 toward the first magnetic domain Da along a direction (e.g., the third direction D3) perpendicular to an interface between the first magnetic pattern 120 and a corresponding one of the plurality of tunnel barrier patterns 140. The write current Isw may have a magnitude greater than that of the read current Tread. The magnetization direction 150MD of the first magnetic domain Da may be reversed by spin transfer torque caused by the write current Isw. For example, owing to the spin transfer torque caused by the write current Isw, the magnetization direction 150MD of the first magnetic domain Da may be switched antiparallel to the magnetization direction 120MD of the first magnetic pattern 120.

Thereafter, referring to FIGS. 2, 7A, and 7B, the current I may flow again through the one of the plurality of second magnetic patterns 150. The rest of the plurality of second magnetic patterns 150 may be held in an electrical floating state F. When the current I flows through the one of the plurality of second magnetic patterns 150, the motion of the magnetic domain walls DW may allow the second magnetic domain Db to align with the first magnetic pattern 120. The first magnetic pattern 120 and the second magnetic domain Db may constitute the second magnetic tunnel junction MTJ2. For example, the magnetization direction 150MD of the second magnetic domain Db may be antiparallel to the magnetization direction 120MD of the first magnetic pattern 120.

The write current Isw may flow through the second magnetic tunnel junction MTJ2. The write current Isw may flow from the second magnetic domain Db toward the first magnetic pattern 120 along a direction (e.g., a direction opposite to the third direction D3) perpendicular to an interface between the first magnetic pattern 120 and a corresponding one of the plurality of tunnel barrier patterns 140. The magnetization direction 150MD of the second magnetic domain Db may be reversed by spin transfer torque caused by the write current Isw. For example, owing to the spin transfer torque caused by the write current Isw, the magnetization direction 150MD of the second magnetic domain Db may be switched parallel to the magnetization direction 120MD of the first magnetic pattern 120.

According to some embodiments of the present inventive concepts, the first magnetic pattern 120 may run across the plurality of second magnetic patterns 150 and also may be connected in common to the plurality of second magnetic patterns 150. In this case, the write operation mentioned above may be sequentially and individually performed on the plurality of second magnetic patterns 150.

Figure 8A:
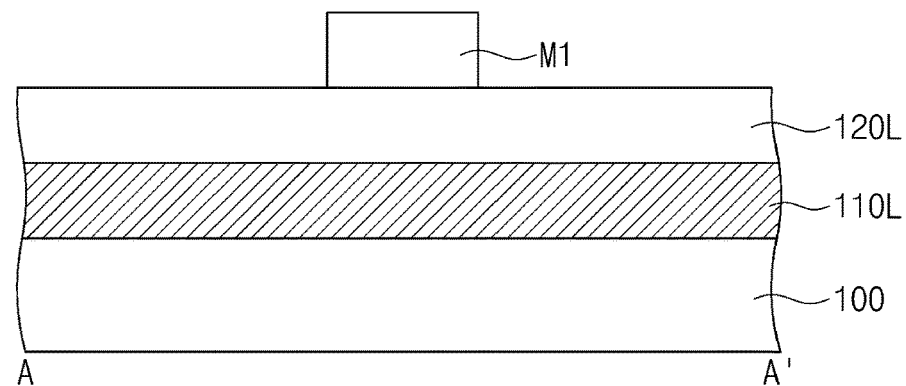
FIGS. 8A to 10B illustrate cross-sectional views showing a method of fabricating a magnetic memory device according to some example embodiments of the present inventive concepts.
Figure 8A:
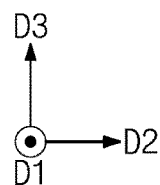
Figure 8B:
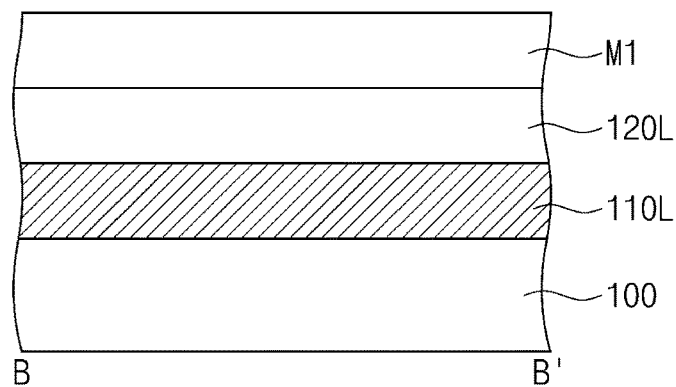
Figure 8B:
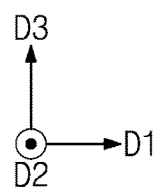
Figure 9A:
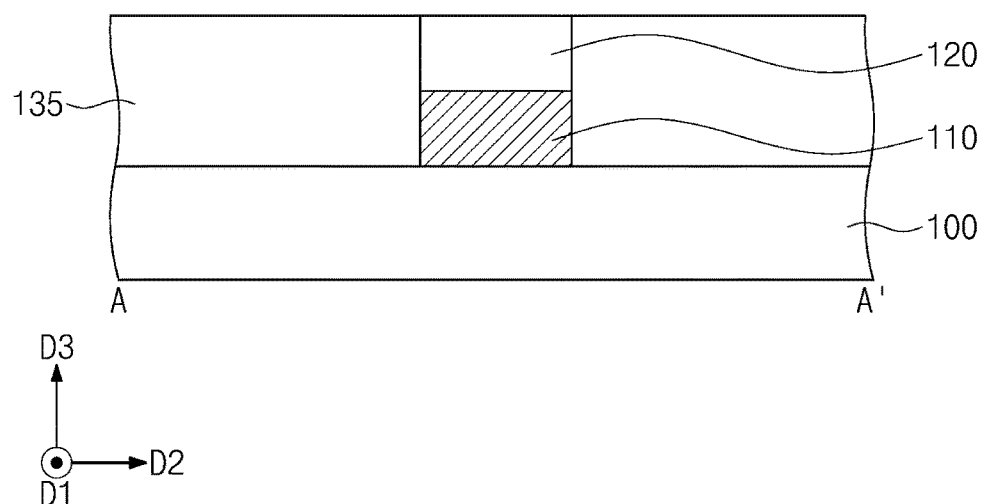
Figure 9B:
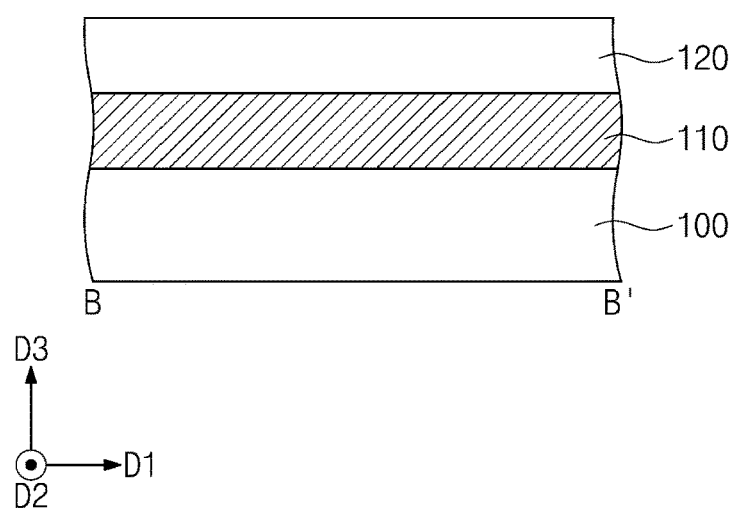
Figure 10A:
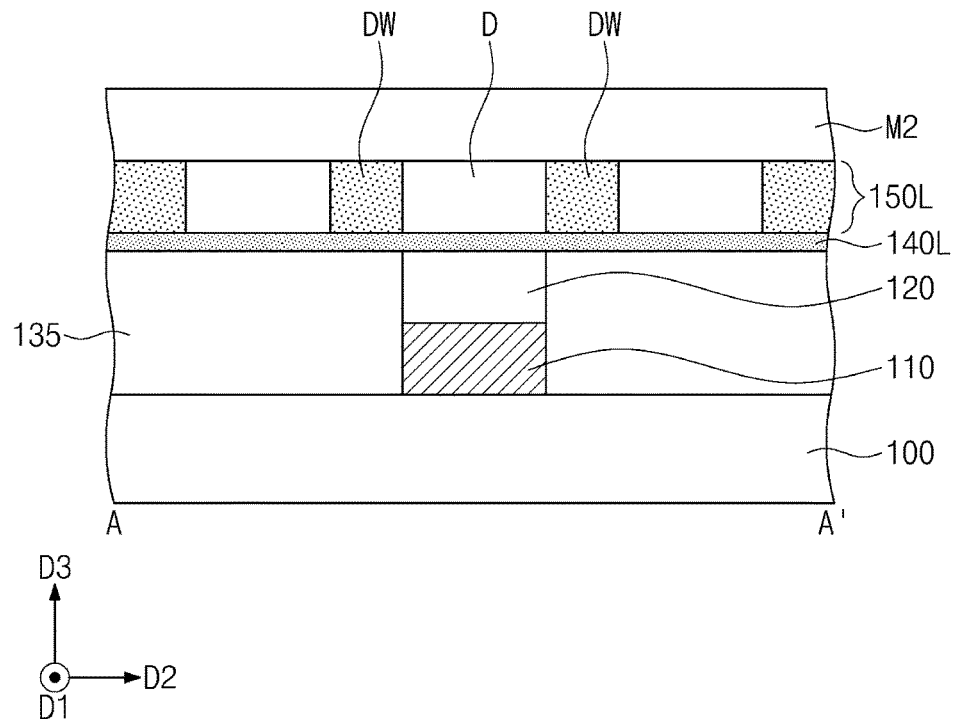
Figure 10B:
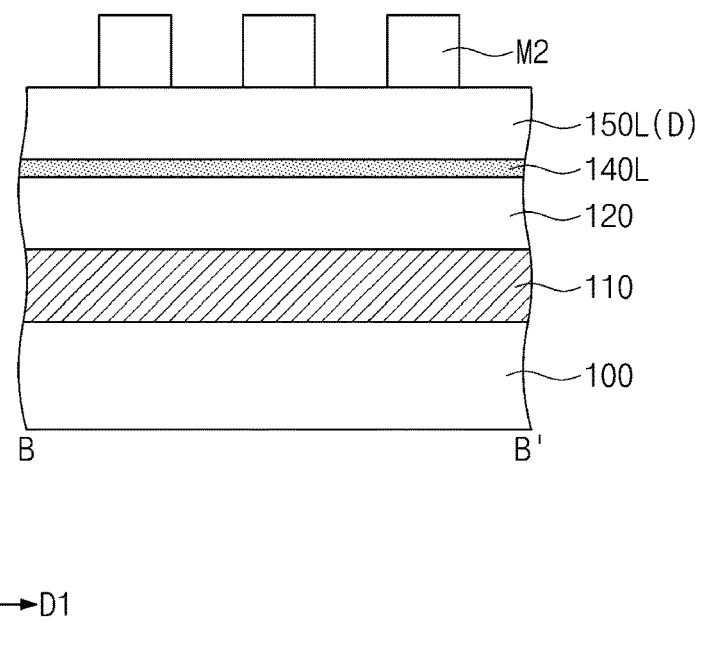

FIGS. 8A to 10B illustrate cross-sectional views showing a method of fabricating a magnetic memory device according to some example embodiments of the present inventive concepts. FIGS. 8A, 9A, and 10A illustrate cross-sectional views taken along line A-A' of FIG. 2. FIGS. 8B, 9B, and 10B illustrate cross-sectional views taken along line B-B' of FIG. 2. Omission(s) may be made to avoid duplicate explanation of the magnetic memory device discussed above with reference to FIGS. 2 and 3A to 3D.

Referring to FIGS. 2, 8A, and 8B, a conductive layer 110L and a first magnetic layer 120L may be sequentially formed on a substrate 100. The conductive layer 110L may be interposed between the substrate 100 and the first magnetic layer 120L. The conductive layer 110L and the first magnetic layer 120L may be formed by using chemical vapor deposition or physical vapor deposition (e.g., sputtering deposition). A first mask pattern M1 may be formed on the first magnetic layer 120L. The first mask pattern M1 may have a linear shape extending in a first direction D1. The first mask pattern M1 may include a material having an etch selectivity with respect to the conductive layer 110L and the first magnetic layer 120L.

Referring to FIGS. 2, 9A, and 9B, a first etching process may be performed in which the first mask pattern M1 is used as an etching mask to etch the first magnetic layer 120L and the conductive layer 110L. The first etching process may be performed such that the first magnetic layer 120L and the conductive layer 110L may be sequentially etched to form a first magnetic pattern 120 and a conductive line 110. The first magnetic pattern 120 and the conductive line 110 may be formed by using a single photomask that defines the first mask pattern M1, as a result, the first magnetic pattern 120 and the conductive line 110 may have substantially the same planar shape. For example, the first magnetic pattern 120 and the conductive line 110 may each have a linear shape extending in the first direction D1.

An interlayer dielectric layer 135 may be formed on the substrate 100, thereby covering sidewalls of the first magnetic pattern 120 and the conductive line 110. The formation of the interlayer dielectric layer 135 may include, for example, forming on the substrate 100 a dielectric layer that covers the first magnetic pattern 120 and the conductive line 110, and performing on the dielectric layer a planarization process to expose a top surface of the first magnetic pattern 120. In some embodiments, the first mask pattern M1 may be removed during the planarization process.

Referring to FIGS. 2, 10A, and 10B, a tunnel barrier layer 140L and a second magnetic layer 150L may be sequentially formed on the interlayer dielectric layer 135, thereby covering the top surface of the first magnetic pattern 120. The tunnel barrier layer 140L may be interposed between the interlayer dielectric layer 135 and the second magnetic layer 150L, and may extend between the second magnetic layer 150L and the top surface of the first magnetic pattern 120. The tunnel barrier layer 140L and the second magnetic layer 150L may be formed by using chemical vapor deposition or physical vapor deposition (e.g., sputtering deposition). The second magnetic layer 150L may include a plurality of magnetic domains D and a plurality of magnetic domain walls DW.

Second mask patterns M2 may be formed on the second magnetic layer 150L. Each of the second mask patterns M2 may have a linear shape extending in a second direction D2. The second mask patterns M2 may be spaced apart from each other along the first direction D1. The second mask patterns M2 may include a material having an etch selectivity with respect to the tunnel barrier layer 140L and the second magnetic layer 150L.

Referring back to FIGS. 2, 3A, and 3B, a second etching process may be performed in which the second mask patterns M2 are used as an etching mask to etch the second magnetic layer 150L and the tunnel barrier layer 140L. The second etching process may be performed such that the second magnetic layer 150L and the tunnel barrier layer 140L may be sequentially etched to form second magnetic patterns 150 and tunnel barrier patterns 140. The second magnetic patterns 150 may run across the first magnetic pattern 120 and the conductive line 110, and may extend along the second direction D2 onto the interlayer dielectric layer 135. Each of the tunnel barrier patterns 140 may be interposed between the first magnetic pattern 120 and a corresponding one of the second magnetic patterns 150, and may extend along the second direction D2 between the corresponding second magnetic pattern 150 and the interlayer dielectric layer 135. The second magnetic patterns 150 and the tunnel barrier patterns 140 may be formed by using a single photomask that defines the second mask patterns M2. As a result, the second magnetic patterns 150 and the tunnel barrier patterns 140 may have the same planar shape. For example, the second magnetic patterns 150 may each have a linear shape extending in the second direction D2 and may be spaced apart from each other in the first direction D1. The tunnel barrier patterns 140 may each have a linear shape extending in the second direction D2 and may be spaced apart from each other in the first direction D1.

When a plurality of first magnetic patterns are disposed below corresponding second magnetic patterns 150, the plurality of first magnetic patterns may be formed by using a different photomask from that used for forming the conductive line 110. Therefore, an increased number of photomasks may be used to fabricate a magnetic memory device. Moreover, when the second magnetic patterns 150 are formed, an alignment may be performed between each of the second magnetic patterns 150 and its corresponding first magnetic pattern. Thus, a process margin may decrease in forming the second magnetic patterns 150.

According to the present inventive concepts, the first magnetic pattern 120 may be formed to extend in the first direction D1 to run across the plurality of second magnetic patterns 150. In this case, the first magnetic pattern 120 and the conductive line 110 may be formed by using a single photomask that defines the first mask pattern M1. In this sense, no additional photomask may be needed to form the first magnetic pattern 120. Therefore, it may be possible to reduce the number of photomasks used for fabricating a magnetic memory device. Furthermore, because the plurality of second magnetic patterns 150 are formed to run across the first magnetic pattern 120, an easy alignment may be established between the first magnetic pattern 120 and the plurality of second magnetic patterns 150. Thus, a process margin may increase in forming the second magnetic patterns 150. As a result, the magnetic memory device may be easily mass-fabricated.

Figure 11:
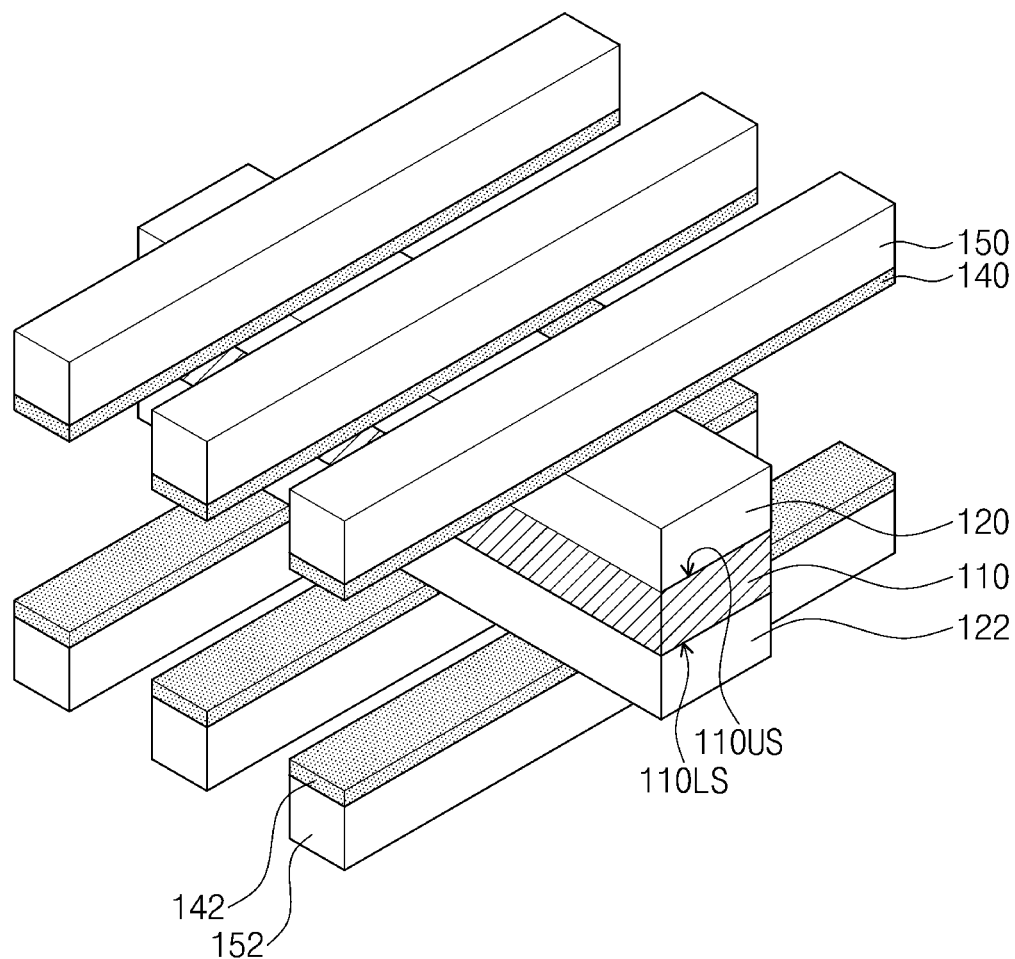
FIG. 11 illustrates a simplified perspective view showing a magnetic memory device according to some example embodiments of the present inventive concepts.
Figure 11:
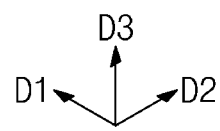

FIG. 11 illustrates a simplified perspective view showing a magnetic memory device according to some example embodiments of the present inventive concepts. The following will mainly explain differences from the magnetic memory device discussed above with reference to FIG. 1.

Referring to FIG. 11, the conductive line 110 may have a first surface 110US and a second surface 110LS opposite to each other. The first magnetic pattern 120 may be disposed on the first surface 110US of the conductive line 110. The plurality of second magnetic patterns 150 may be disposed on the first magnetic pattern 120, while running across the first magnetic pattern 120. The plurality of second magnetic patterns 150 may be spaced apart in the third direction D3 from the first surface 110US of the conductive line 110, and the first magnetic pattern 120 may be disposed between the first surface 110US of the conductive line 110 and the plurality of second magnetic patterns 150. A plurality of first tunnel barrier patterns 140 may be interposed between the first magnetic pattern 120 and the plurality of second magnetic patterns 150. The plurality of first tunnel barrier patterns 140 may be substantially the same as the plurality of tunnel barrier patterns 140 discussed above with reference to FIG. 1.

In some embodiments, a third magnetic pattern 122 may be disposed on the second surface 110LS of the conductive line 110. The conductive line 110 may be placed between the first magnetic pattern 120 and the third magnetic pattern 122. The first magnetic pattern 120 and the third magnetic pattern 122 may be spaced apart in the third direction D3 from each other across the conductive line 110, and may extend parallel to the conductive line 110 along the first direction D1. The first magnetic pattern 120, the conductive line 110, and the third magnetic pattern 122 may run across the plurality of second magnetic patterns 150.

A plurality of fourth magnetic patterns 152 may be disposed on the third magnetic pattern 122, while running across the third magnetic pattern 122. The plurality of fourth magnetic patterns 152 may extend in the second direction D2 and may be spaced apart from each other along the first direction D1. The plurality of fourth magnetic patterns 152 may be spaced apart from the second surface 110LS of the conductive line 110 along a direction opposite to the third direction D3. The third magnetic pattern 122 may be disposed between the second surface 110LS of the conductive line 110 and the plurality of fourth magnetic patterns 152. The first magnetic pattern 120, the conductive line 110, and the third magnetic pattern 122 may run across the plurality of fourth magnetic patterns 152.

A plurality of second tunnel barrier patterns 142 may be interposed between the third magnetic pattern 122 and the plurality of fourth magnetic patterns 152. The plurality of second tunnel barrier patterns 142 may extend in the second direction D2 and may be spaced apart from each other along the first direction D1. Each of the plurality of second tunnel barrier patterns 142 may be interposed between the third magnetic pattern 122 and a corresponding one of the plurality of fourth magnetic patterns 152.

Figure 12:
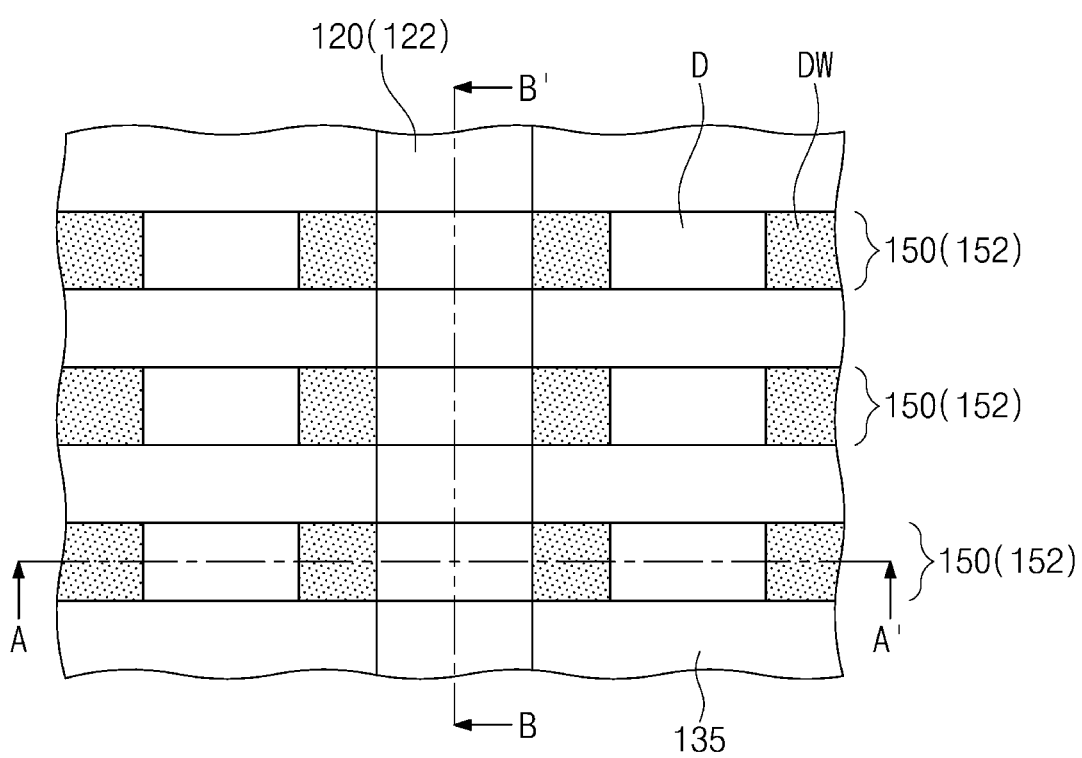
FIG. 12 illustrates a plan view showing a magnetic memory device according to some example embodiments of the present inventive concepts.
Figure 13A:
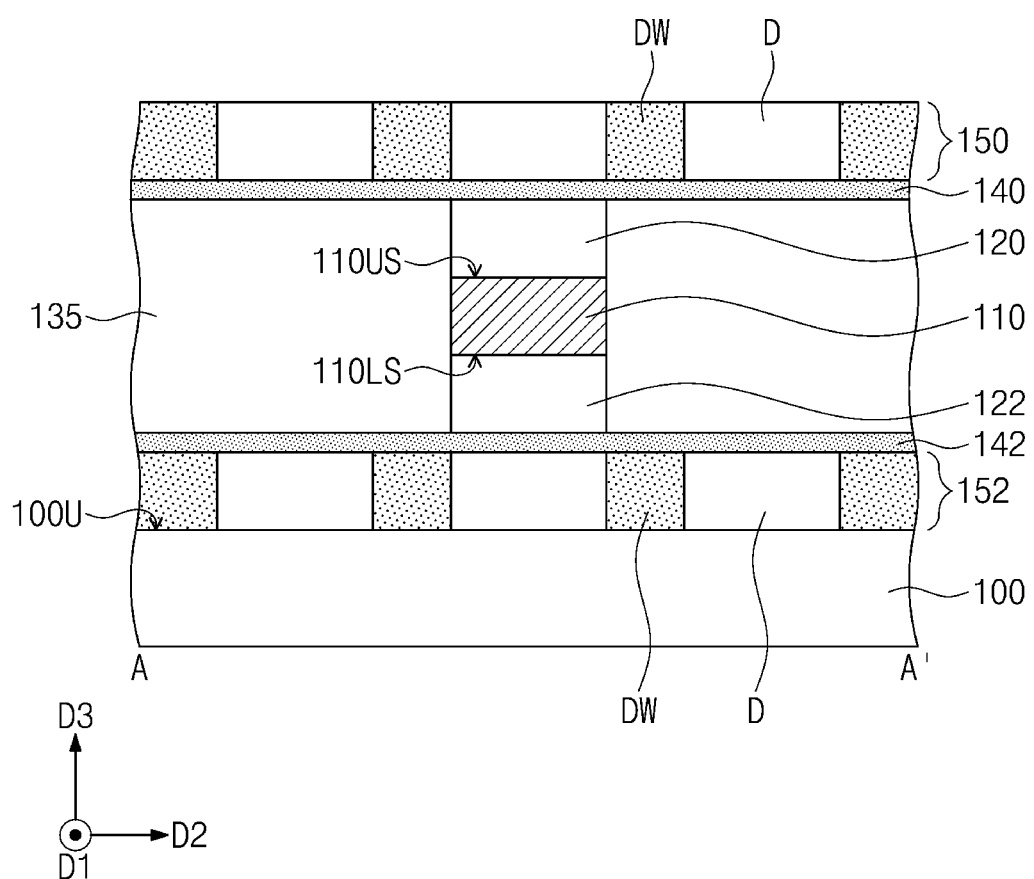
FIG. 13A illustrates a cross-sectional view taken along line A-A' of FIG. 12.
Figure 13B:
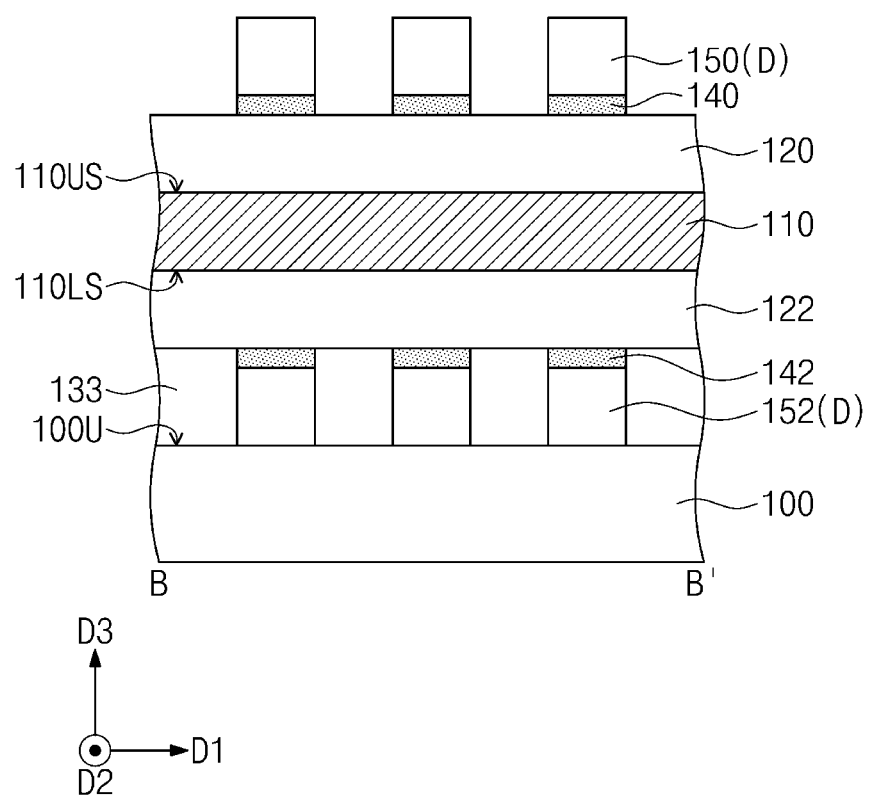
FIG. 13B illustrates a cross-sectional view taken along line B-B' of FIG. 12.

FIG. 12 illustrates a plan view showing a magnetic memory device according to some example embodiments of the present inventive concepts. FIG. 13A illustrates a cross-sectional view taken along line A-A' of FIG. 12. FIG. 13B illustrates a cross-sectional view taken along line B-B' of FIG. 12. The following will mainly describe differences from the magnetic memory device discussed above with reference to FIGS. 2, 3A, and 3B.

Referring to FIGS. 12, 13A, and 13B, the substrate 100 may be provided thereon with the conductive line 110 that extends in the first direction D1 parallel to the top surface 100U of the substrate 100. The conductive line 110 may have a first surface 110US and a second surface 110LS opposite to each other. The second surface 110LS may be closer than the first surface 110US to the substrate 100. The first and second surfaces 110US and 110LS of the conductive line 110 may be parallel to the top surface 100U of the substrate 100. The first magnetic pattern 120 may be disposed on the first surface 110US of the conductive line 110, while extending in the first direction D1.

In some embodiments, a third magnetic pattern 122 may be disposed on the second surface 110LS of the conductive line 110, while extending in the first direction D1. The third magnetic pattern 122 may be disposed between the substrate 100 and the conductive line 110. The conductive line 110 may be placed between the first magnetic pattern 120 and the third magnetic pattern 122. The first magnetic pattern 120 and the third magnetic pattern 122 may be spaced apart from each other across the conductive line 110 in a direction perpendicular to the top surface 100U of the substrate 100, and may extend parallel to the conductive line 110 along the first direction D1. The first magnetic pattern 120 and the third magnetic pattern 122 may vertically overlap the conductive line 110 along the third direction D3. The third magnetic pattern 122 may include substantially the same material as that of the first magnetic pattern 120.

The substrate 100 may be provided thereon with an upper interlayer dielectric layer 135 that covers the conductive line 110 and the first and third magnetic patterns 120 and 122. The upper interlayer dielectric layer 135 may be substantially the same as the interlayer dielectric layer 135 discussed above with reference to FIGS. 2, 3A, and 3B. The upper interlayer dielectric layer 135 may cover a lateral surface of each of the conductive line 110, the first magnetic pattern 120, and the third magnetic pattern 122. The first magnetic pattern 120 may have a top surface substantially coplanar with that of the upper interlayer dielectric layer 135, and the third magnetic pattern 122 may have a bottom surface substantially coplanar with that of the upper interlayer dielectric layer 135.

The upper interlayer dielectric layer 135 may be provided thereon with the plurality of second magnetic patterns 150 that run across the first magnetic pattern 120. The plurality of second magnetic patterns 150 may be spaced apart in the third direction D3 from the first surface 110US of the conductive line 110, and the first magnetic pattern 120 may be disposed between the first surface 110US of the conductive line 110 and the plurality of second magnetic patterns 150. The first magnetic pattern 120, the conductive line 110, and the third magnetic pattern 122 may run across the plurality of second magnetic patterns 150.

A plurality of first tunnel barrier patterns 140 may be interposed between the first magnetic pattern 120 and the plurality of second magnetic patterns 150. The plurality of first tunnel barrier patterns 140 may be substantially the same as the tunnel barrier patterns 140 discussed above with reference to FIGS. 2, 3A, and 3B. Each of the plurality of first tunnel barrier patterns 140 may be interposed between the first magnetic pattern 120 and a corresponding one of the plurality of second magnetic patterns 150, and may extend between the corresponding second magnetic pattern 150 and the upper interlayer dielectric layer 135.

A plurality of fourth magnetic patterns 152 may be disposed between the substrate 100 and the third magnetic pattern 122. The plurality of fourth magnetic patterns 152 may run across the third magnetic pattern 122. The plurality of fourth magnetic patterns 152 may extend in the second direction D2 and may be spaced apart from each other along the first direction D1. The plurality of fourth magnetic patterns 152 may be spaced apart from the second surface 110LS of the conductive line 110 along a direction opposite to the third direction D3, and may be disposed between the second surface 110LS of the conductive line 110 and the substrate 100. The first magnetic pattern 120, the conductive line 110, and the third magnetic pattern 122 may run across the plurality of fourth magnetic patterns 152. Each of the plurality of fourth magnetic patterns 152 may include a plurality of magnetic domains D and a plurality of magnetic domain walls DW. In each of the plurality of fourth magnetic patterns 152, the plurality of magnetic domains D and the plurality of magnetic domain walls DW may be arranged alternately and repeatedly along the second direction D2. The plurality of fourth magnetic patterns 152 may include substantially the same material as that of the plurality of second magnetic patterns 150.

A plurality of second tunnel barrier patterns 142 may be interposed between the third magnetic pattern 122 and the plurality of fourth magnetic patterns 152. The plurality of second tunnel barrier patterns 142 may extend in the second direction D2 and may be spaced apart from each other along the first direction D1. Each of the plurality of second tunnel barrier patterns 142 may be interposed between the third magnetic pattern 122 and a corresponding one of the plurality of fourth magnetic patterns 152, and may extend between the corresponding fourth magnetic pattern 152 and the upper interlayer dielectric layer 135. The plurality of second tunnel barrier patterns 142 may include substantially the same material as that of the plurality of first tunnel barrier patterns 140.

The substrate 100 and the upper interlayer dielectric layer 135 may have therebetween a lower interlayer dielectric layer 133 that covers sidewalls of the plurality of fourth magnetic patterns 152 and the plurality of second tunnel barrier patterns 142. The lower interlayer dielectric layer 133 may include, for example, one or more of silicon oxide, silicon nitride, and silicon oxynitride.

Each of the first and third magnetic patterns 120 and 122 may be a reference layer whose magnetization direction is fixed in one direction. Each of the second and fourth magnetic patterns 150 and 152 may be a free layer whose magnetization direction is switchable. In each of the second magnetic patterns 150, each of the magnetic domains D may have a magnetization direction capable of being oriented parallel or antiparallel to the magnetization direction of the first magnetic pattern 120. In each of the fourth magnetic patterns 152, each of the magnetic domains D may have a magnetization direction capable of being oriented parallel or antiparallel to the magnetization direction of the third magnetic pattern 122. For example, likewise to that discussed above with reference to FIG. 3C, the magnetization directions of the first and third magnetic patterns 120 and 122 and the magnetization direction of each of the magnetic domains D in the second and fourth magnetic patterns 150 and 152 may be perpendicular to an interface between the first magnetic pattern 120 and each of first tunnel barrier patterns 140 and also to an interface between the third magnetic pattern 122 and each of the second tunnel barrier patterns 142. For another example, likewise to that discussed above with reference to FIG. 3D, the magnetization directions of the first and third magnetic patterns 120 and 122 and the magnetization direction of each of the magnetic domains D in the second and fourth magnetic patterns 150 and 152 may be parallel to an interface between the first magnetic pattern 120 and each of first tunnel barrier patterns 140 and also to an interface between the third magnetic pattern 122 and each of the second tunnel barrier patterns 142.

The first magnetic pattern 120 may extend in the first direction D1 and be connected in common to the plurality of second magnetic patterns 150, and the third magnetic pattern 122 may extend in the first direction D1 and be connected in common to the plurality of fourth magnetic patterns 152. The first magnetic pattern 120 may extend from a first location between the conductive line 110 and one of the plurality of second magnetic patterns 150 toward (and/or to) a second location between the conductive line 110 and another of the plurality of second magnetic patterns 150. The third magnetic pattern 122 may extend from a third location between the conductive line 110 and one of the plurality of fourth magnetic patterns 152 toward (and/or to) a fourth location between the conductive line 110 and another of the plurality of fourth magnetic patterns 152.

Figure 14A:
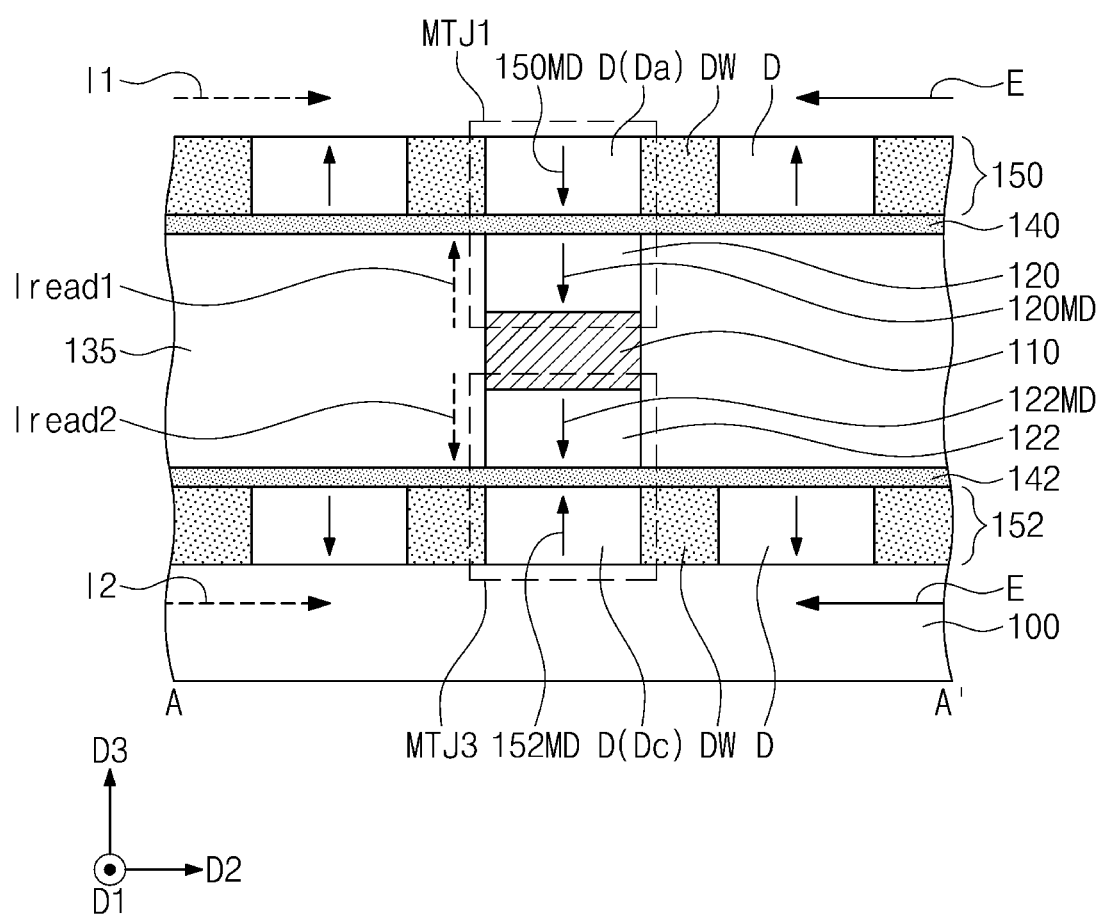
FIGS. 14A and 14B illustrate conceptual views showing a read operation of a magnetic memory device according to some example embodiments of the present inventive concepts.
Figure 14B:
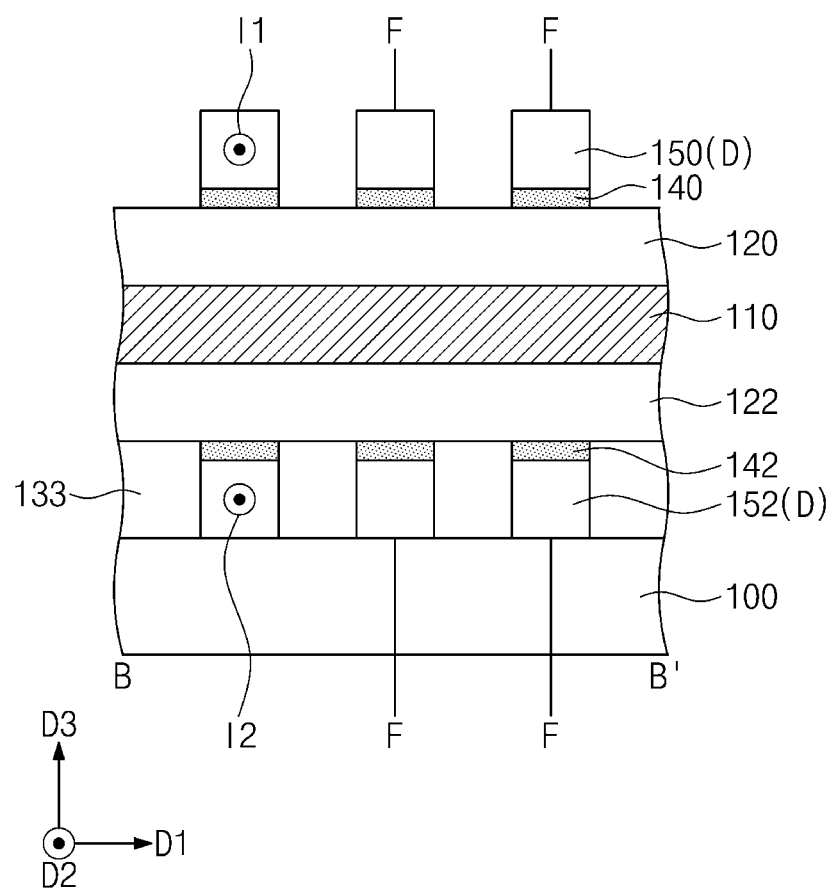

FIGS. 14A and 14B illustrate conceptual views showing a read operation of a magnetic memory device according to some example embodiments of the present inventive concepts. FIG. 14A illustrates a cross-sectional view taken along line A-A' of FIG. 12. FIG. 14B illustrates a cross-sectional view taken along line B-B' of FIG. 12. The following will mainly describe differences from the read operation of the magnetic memory device discussed above with reference to FIGS. 4A, 4B, 5A, and 5B.

Referring to FIGS. 2, 14A, and 14B, a first current I1 to move the magnetic domain walls DW may flow through one of the plurality of second magnetic patterns 150. The rest of the plurality of second magnetic patterns 150 may be held in an electrical floating state F. For example, in the one of the plurality of second magnetic patterns 150, the first current I1 may flow in the second direction D2, and the magnetic domain walls DW may move in a direction (e.g., a moving direction of electrons E) opposite to the second direction D2. In the one of the plurality of second magnetic patterns 150, the magnetization direction 150MD of each of the magnetic domains D may be parallel or antiparallel to the magnetization direction 120MD of the first magnetic pattern 120. When the first current I1 flows through the one of the plurality of second magnetic patterns 150, the motion of the magnetic domain walls DW may allow the first magnetic domain Da to align with the first magnetic pattern 120. The first magnetic pattern 120 and the first magnetic domain Da may constitute the first magnetic tunnel junction MTJ1.

A second current I2 to move the magnetic domain walls DW may flow through one of the plurality of fourth magnetic patterns 152. The rest of the plurality of fourth magnetic patterns 152 may be held in an electrical floating state F. For example, in the one of the plurality of fourth magnetic patterns 152, the second current I2 may flow in the second direction D2, and the magnetic domain walls DW may move in a direction (e.g., a moving direction of electrons E) opposite to the second direction D2. In the one of the plurality of fourth magnetic patterns 152, a magnetization direction 152MD of each of the magnetic domains D may be parallel or antiparallel to a magnetization direction 122MD of the third magnetic pattern 122. When the second current I2 flows through the one of the plurality of fourth magnetic patterns 152, the motion of the magnetic domain walls DW may allow a third magnetic domain Dc to align with the third magnetic pattern 122. The third magnetic pattern 122 and the third magnetic domain Dc may constitute a third magnetic tunnel junction MTJ3.

A first read current Iread1 may flow through the first magnetic tunnel junction MTJ1, and a second read current Iread2 may flow through the third magnetic tunnel junction MTJ3. The first read current Iread1 and the second read current Iread2 may be provided simultaneously or sequentially. The first read current Iread1 may flow from the first magnetic pattern 120 toward the first magnetic domain Da along a direction (e.g., the third direction D3) perpendicular to an interface between the first magnetic pattern 120 and a corresponding one of the plurality of first tunnel barrier patterns 140. The first read current Iread1 may detect a resistance state of the first magnetic tunnel junction MTJ1. For example, the magnetization direction 150MD of the first magnetic domain Da may be parallel to the magnetization direction 120MD of the first magnetic pattern 120 and, in this case, the first magnetic tunnel junction MTJ1 may be held in a low-resistance state. A data (e.g., a logic state of 0 or 1) stored in the first magnetic domain Da may be detected from the resistance state of the first magnetic tunnel junction MTJ1. The second read current Iread2 may flow from the third magnetic pattern 122 toward the third magnetic domain Dc along a direction (e.g., a direction opposite to the third direction D3) perpendicular to an interface between the third magnetic pattern 122 and a corresponding one of the plurality of second tunnel barrier patterns 142. The second read current Iread2 may detect a resistance state of the third magnetic tunnel junction MTJ3. For example, the magnetization direction 152MD of the third magnetic domain Dc may be antiparallel to the magnetization direction 122MD of the third magnetic pattern 122 and, in this case, the third magnetic tunnel junction MTJ3 may be held in a high-resistance state. A data (e.g., a logic state of 1 or 0) stored in the third magnetic domain Dc may be detected from the resistance state of the third magnetic tunnel junction MTJ3.

According to some embodiments of the present inventive concepts, the first magnetic pattern 120 may run across the plurality of second magnetic patterns 150 and also may be connected in common to the plurality of second magnetic patterns 150. Moreover, the third magnetic pattern 122 may run across the plurality of fourth magnetic patterns 152 and also may be connected in common to the plurality of fourth magnetic patterns 152. In this case, the first magnetic pattern 120 and the third magnetic pattern 122 may be used to simultaneously perform read operations on one of the plurality of second magnetic patterns 150 and one of the plurality of fourth magnetic patterns 152.

Figure 15A:
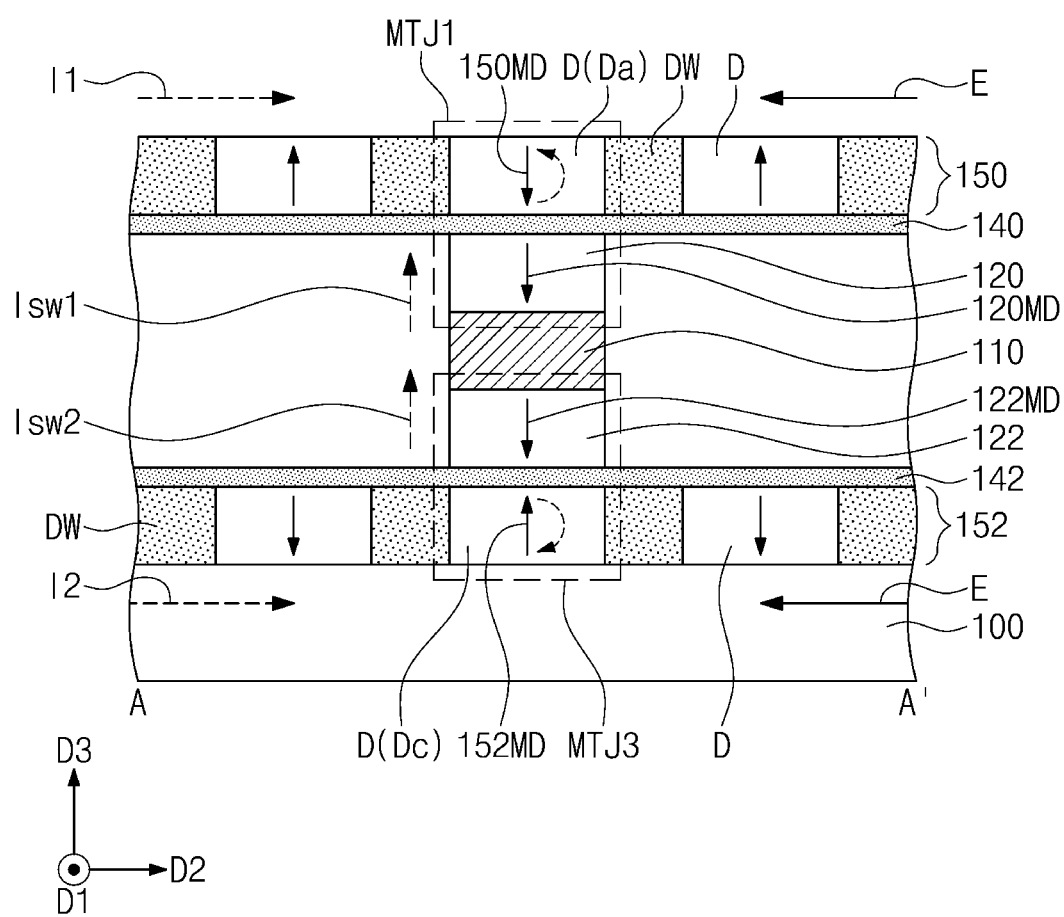
FIGS. 15A and 15B illustrate conceptual views showing a write operation of a magnetic memory device according to some example embodiments of the present inventive concepts.
Figure 15B:
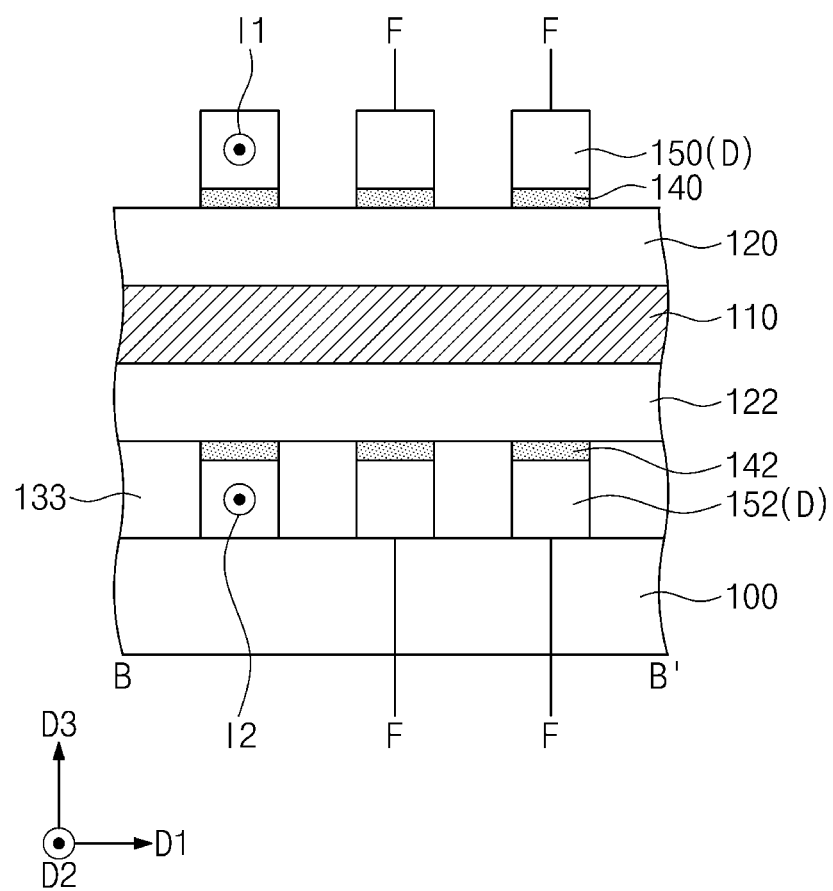

FIGS. 15A and 15B illustrate conceptual views showing a write operation of a magnetic memory device according to some example embodiments of the present inventive concepts. FIG. 15A illustrates a cross-sectional view taken along line A-A' of FIG. 12. FIG. 15B illustrates a cross-sectional view taken along line B-B' of FIG. 12. The following will mainly describe differences from the write operation of the magnetic memory device discussed above with reference to FIGS. 6A, 6B, 7A, and 7B.

Referring to FIGS. 2, 15A, and 15B, the first current I1 to move the magnetic domain walls DW may flow through one of the plurality of second magnetic patterns 150. The rest of the plurality of second magnetic patterns 150 may be held in an electrical floating state F. When the first current I1 flows through the one of the plurality of second magnetic patterns 150, the motion of the magnetic domain walls DW may allow the first magnetic domain Da to align with the first magnetic pattern 120. The first magnetic pattern 120 and the first magnetic domain Da may constitute the first magnetic tunnel junction MTJ1. For example, the magnetization direction 150MD of the first magnetic domain Da may be parallel to the magnetization direction 120MD of the first magnetic pattern 120. The second current I2 to move the magnetic domain walls DW may flow through one of the plurality of fourth magnetic patterns 152. The rest of the plurality of fourth magnetic patterns 152 may be held in an electrical floating state F. When the second current I2 flows through the one of the plurality of fourth magnetic patterns 152, the motion of the magnetic domain walls DW may allow the third magnetic domain Dc to align with the third magnetic pattern 122. The third magnetic pattern 122 and the third magnetic domain Dc may constitute the third magnetic tunnel junction MTJ3. For example, the magnetization direction 152MD of the third magnetic domain Dc may be antiparallel to the magnetization direction 122MD of the third magnetic pattern 122.

A first write current Isw1 may flow through the first magnetic tunnel junction MTJ1, and a second write current Isw2 may flow through the third magnetic tunnel junction MTJ3. The first write current Isw1 and the second write current Isw2 may be provided simultaneously or sequentially. Each of the first and second write currents Isw1 and Isw2 may have a magnitude greater than that of the first read current Iread1 and that of the second read current Iread2. The first write current Isw1 may flow from the first magnetic pattern 120 toward the first magnetic domain Da along a direction (e.g., the third direction D3) perpendicular to an interface between the first magnetic pattern 120 and a corresponding one of the plurality of first tunnel barrier patterns 140. The magnetization direction 150MD of the first magnetic domain Da may be reversed by spin transfer torque caused by the first write current Isw1. For example, owing to the spin transfer torque caused by the first write current Isw1, the magnetization direction 150MD of the first magnetic domain Da may be switched antiparallel to the magnetization direction 120MD of the first magnetic pattern 120. The second write current Isw2 may flow from the third magnetic domain Dc toward the third magnetic pattern 122 along a direction (e.g., the third direction D3) perpendicular to an interface between the third magnetic pattern 122 and a corresponding one of the plurality of second tunnel barrier patterns 142. The magnetization direction 152MD of the third magnetic domain Dc may be reversed by spin transfer torque caused by the second write current Isw2. For example, owing to the spin transfer torque caused by the second write current Isw2, the magnetization direction 152MD of the third magnetic domain Dc may be switched parallel to the magnetization direction 122MD of the third magnetic pattern 122.

According to some embodiments of the present inventive concepts, the first magnetic pattern 120 may run across the plurality of second magnetic patterns 150 and also may be connected in common to the plurality of second magnetic patterns 150. Moreover, the third magnetic pattern 122 may run across the plurality of fourth magnetic patterns 152 and also may be connected in common to the plurality of fourth magnetic patterns 152. In this case, the first magnetic pattern 120 and the third magnetic pattern 122 may be used to simultaneously perform write operations on one of the plurality of second magnetic patterns 150 and one of the plurality of fourth magnetic patterns 152.

Figure 16A:
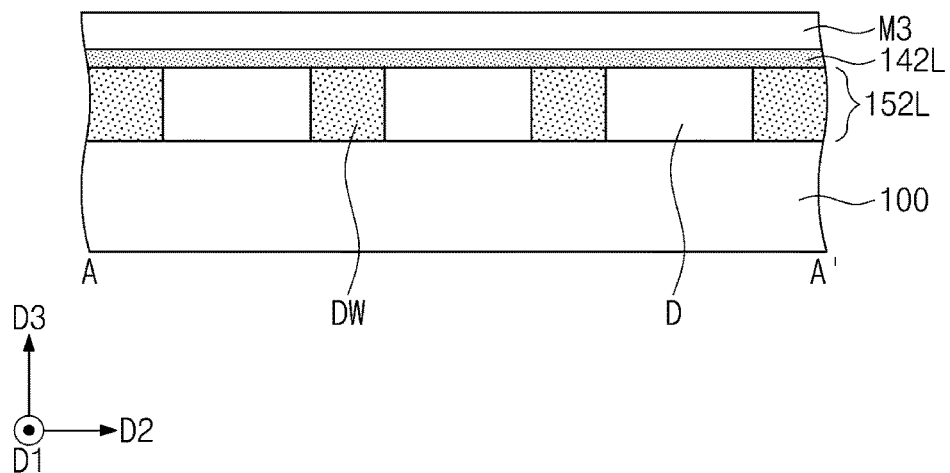
FIGS. 16A to 18B illustrate cross-sectional views showing a method of fabricating a magnetic memory device according to some example embodiments of the present inventive concepts.
Figure 16B:
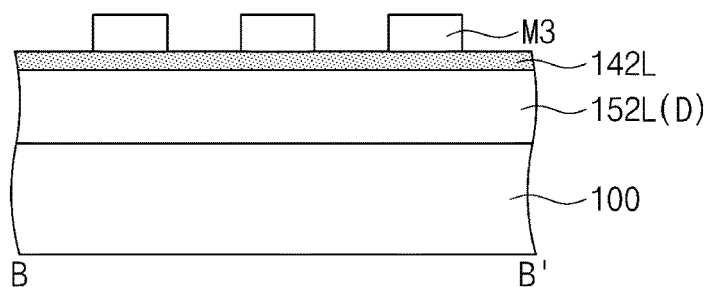
Figure 17A:
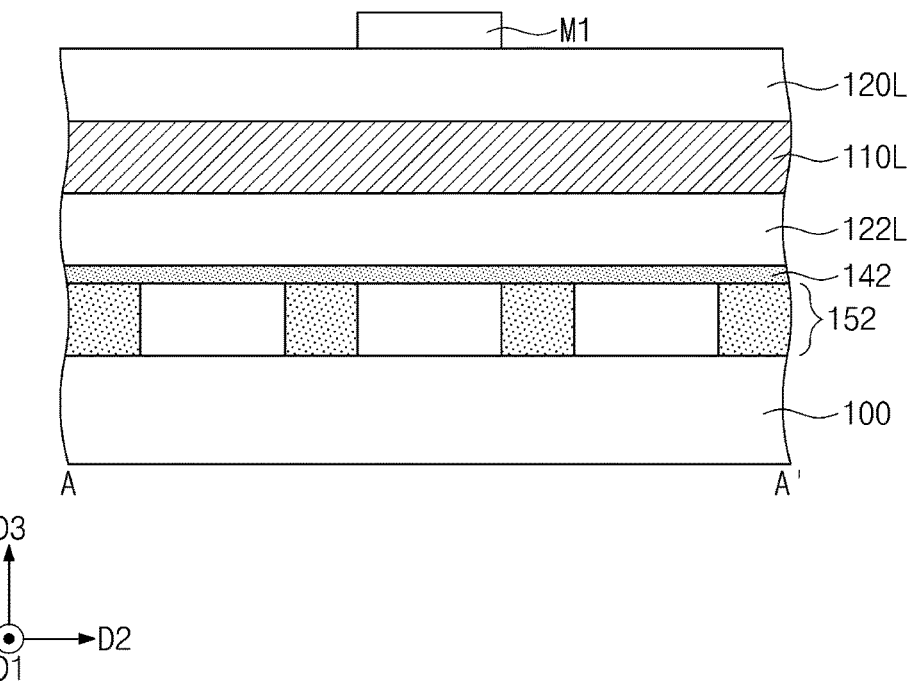
Figure 17B:
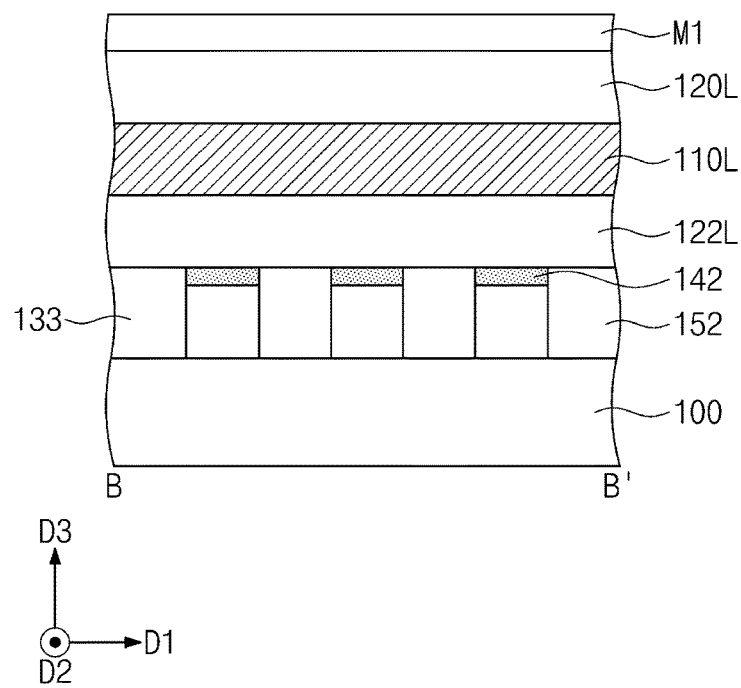
Figure 18A:
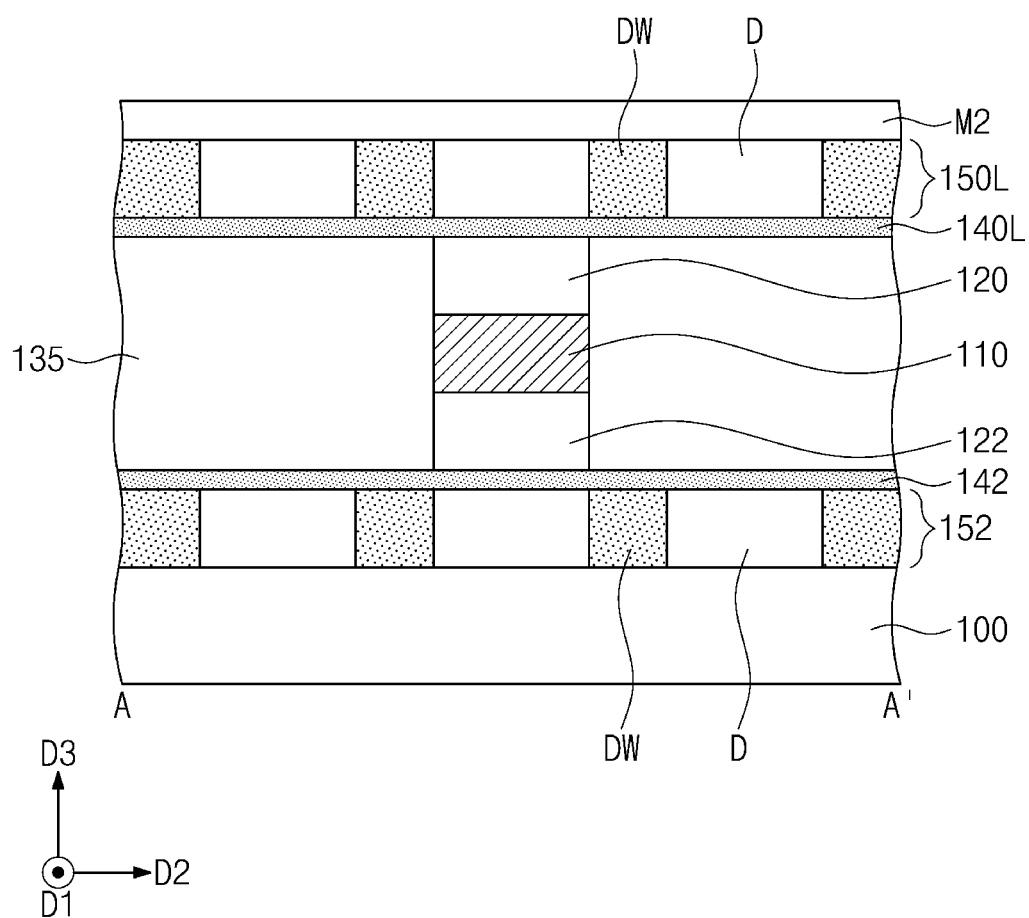
Figure 18B:
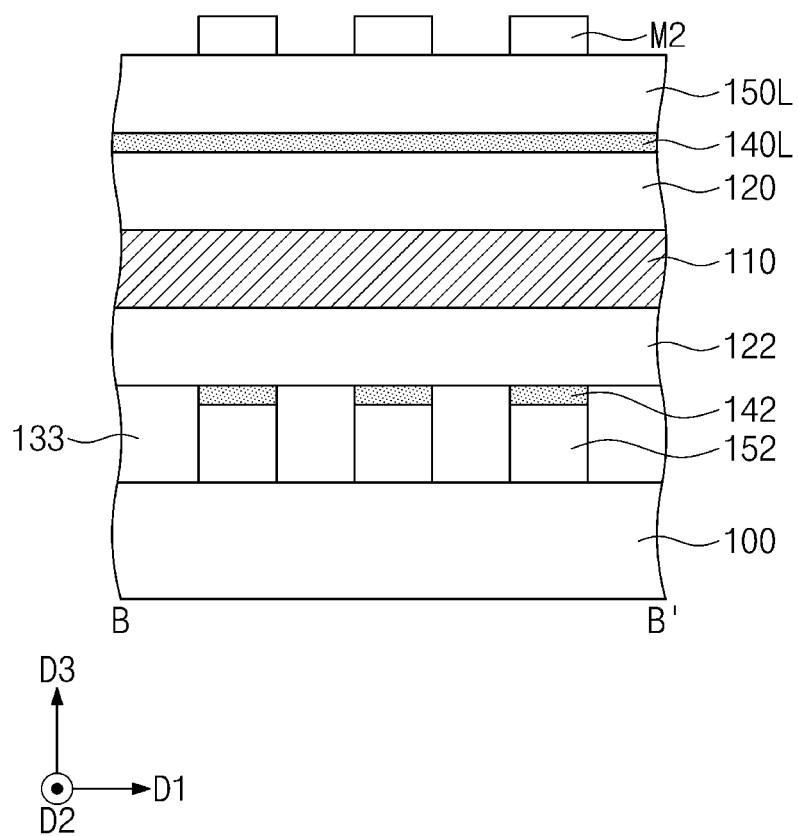

FIGS. 16A to 18B illustrate cross-sectional views showing a method of fabricating a magnetic memory device according to some example embodiments of the present inventive concepts. FIGS. 16A, 17A, and 18A illustrate cross-sectional views taken along line A-A' of FIG. 12. FIGS. 16B, 17B, and 18B illustrate cross-sectional views taken along line B-B' of FIG. 12. For brevity of description, the following will mainly explain differences from the method of fabricating the magnetic memory device discussed above with reference to FIGS. 8A to 10B.

Referring to FIGS. 2, 16A, and 16B, a fourth magnetic layer 152L and a second tunnel barrier layer 142L may be sequentially formed on the substrate 100. The fourth magnetic layer 152L may be formed between the substrate 100 and the second tunnel barrier layer 142L. The fourth magnetic layer 152L and the second tunnel barrier layer 142L may be formed by using chemical vapor deposition or physical vapor deposition (e.g., sputtering deposition). The fourth magnetic layer 152L may include a plurality of magnetic domains D and a plurality of magnetic domain walls DW.

Third mask patterns M3 may be formed on the second tunnel barrier layer 142L. Each of the third mask patterns M3 may have a linear shape extending in the second direction D2. The third mask patterns M3 may be spaced apart from each other along the first direction D1. The third mask patterns M3 may include a material having an etch selectivity with respect to the second tunnel barrier layer 142L and the fourth magnetic layer 152L.

Referring to FIGS. 2, 17A, and 17B, a third etching process may be performed in which the third mask patterns M3 are used as an etching mask to etch the fourth magnetic layer 152L and the second tunnel barrier layer 142L. The third etching process may be performed such that the fourth magnetic layer 152L and the second tunnel barrier layer 142L may be sequentially etched to form fourth magnetic patterns 152 and second tunnel barrier patterns 142. The fourth magnetic patterns 152 and the second tunnel barrier patterns 142 may be formed by using a single photomask that defines the third mask patterns M3, as a result, the fourth magnetic patterns 152 and the second tunnel barrier patterns 142 may have the same planar shape. For example, the fourth magnetic patterns 152 may each have a linear shape extending in the second direction D2 and may be spaced apart from each other in the first direction D1. The second tunnel barrier patterns 142 may each have a linear shape extending in the second direction D2 and may be spaced apart from each other in the first direction D1.

A lower interlayer dielectric layer 133 may be formed on the substrate 100, thereby covering sidewalls of the fourth magnetic patterns 152 and the second tunnel barrier patterns 142. The formation of the lower interlayer dielectric layer 133 may include, for example, forming on the substrate 100 a dielectric layer that covers the fourth magnetic patterns 152 and the second tunnel barrier patterns 142, and performing on the dielectric layer a planarization process to expose top surfaces of the second tunnel barrier patterns 142. In some embodiments, the third mask patterns M3 may be removed during the planarization process.

A third magnetic layer 122L may be formed on the lower interlayer dielectric layer 133, thereby covering the top surfaces of the second tunnel barrier patterns 142. The third magnetic layer 122L be formed by using chemical vapor deposition or physical vapor deposition (e.g., sputtering deposition).

A conductive layer 110L and a first magnetic layer 120L may be sequentially formed on the third magnetic layer 122L. The conductive layer 110L may be interposed between the third magnetic layer 122L and the first magnetic layer 120L. A first mask pattern M1 may be formed on the first magnetic layer 120L. The first mask pattern M1 may have a linear shape extending in the first direction D1. The conductive layer 110L, the first magnetic layer 120L, and the first mask pattern M1 may be formed by substantially the same method as that discussed above with reference to FIGS. 8A and 8B.

Referring to FIGS. 2, 18A, and 18B, a first etching process may be performed in which the first mask pattern M1 is used as an etching mask to etch the first magnetic layer 120L, the conductive layer 110L, and the third magnetic layer 122L. The first etching process may be performed such that the first magnetic layer 120L, the conductive layer 110L, and the third magnetic layer 122L may be sequentially etched to form a first magnetic pattern 120, a conductive line 110, and a third magnetic pattern 122. The first magnetic pattern 120, the conductive line 110, and the third magnetic pattern 122 may be formed by using a single photomask that defines the first mask pattern M1. As a result, the first magnetic pattern 120, the conductive line 110, and the third magnetic pattern 122 may have substantially the same planar shape. For example, the first magnetic pattern 120, the conductive line 110, and the third magnetic pattern 122 may each have a linear shape extending in the first direction D1.

An upper interlayer dielectric layer 135 may be formed on the lower interlayer dielectric layer 133, thereby covering sidewalls of the first magnetic pattern 120, the conductive line 110, and the third magnetic pattern 122. The formation of the upper interlayer dielectric layer 135 may include, for example, forming on the lower interlayer dielectric layer 133 a dielectric layer that covers the first magnetic pattern 120, the conductive line 110, and the third magnetic pattern 122, and performing on the dielectric layer a planarization process to expose a top surface of the first magnetic pattern 120. In some embodiments, the first mask pattern M1 may be removed during the planarization process.

A first tunnel barrier layer 140L and a second magnetic layer 150L may be sequentially formed on the upper interlayer dielectric layer 135, thereby covering the top surface of the first magnetic pattern 120. The second magnetic layer 150L may include a plurality of magnetic domains D and a plurality of magnetic domain walls DW. Second mask patterns M2 may be formed on the second magnetic layer 150L. The first tunnel barrier layer 140L, the second magnetic layer 150L, and the second mask patterns M2 may be formed by substantially the same method as that discussed above with reference to FIGS. 10A and 10B.

Referring back to FIGS. 12, 13A, and 13B, a second etching process may be performed in which the second mask patterns M2 are used as an etching mask to etch the second magnetic layer 150L and the first tunnel barrier layer 140L. The second etching process may be performed such that the second magnetic layer 150L and the first tunnel barrier layer 140L may be sequentially etched to form second magnetic patterns 150 and first tunnel barrier patterns 140. The second magnetic patterns 150 and the first tunnel barrier patterns 140 may be formed by using a single photomask that defines the second mask patterns M2. As a result, the second magnetic patterns 150 and the first tunnel barrier patterns 140 may have the same planar shape. For example, the second magnetic patterns 150 may each have a linear shape extending in the second direction D2 and may be spaced apart from each other in the first direction D1. The first tunnel barrier patterns 140 may each have a linear shape extending in the second direction D2 and may be spaced apart from each other in the first direction D1.

According to the present inventive concepts, the first magnetic pattern 120, the conductive line 110, and the third magnetic pattern 122 may be formed by using a single photomask that defines the first mask pattern M1. Therefore, it may be possible to reduce the number of photomasks used for fabricating a magnetic memory device. Moreover, because the first magnetic pattern 120, the conductive line 110, and the third magnetic pattern 122 are formed to run across the plurality of second magnetic patterns 150 and the plurality of fourth magnetic patterns 152, the magnetic memory device may be easy to achieve high integration.

Figure 19:
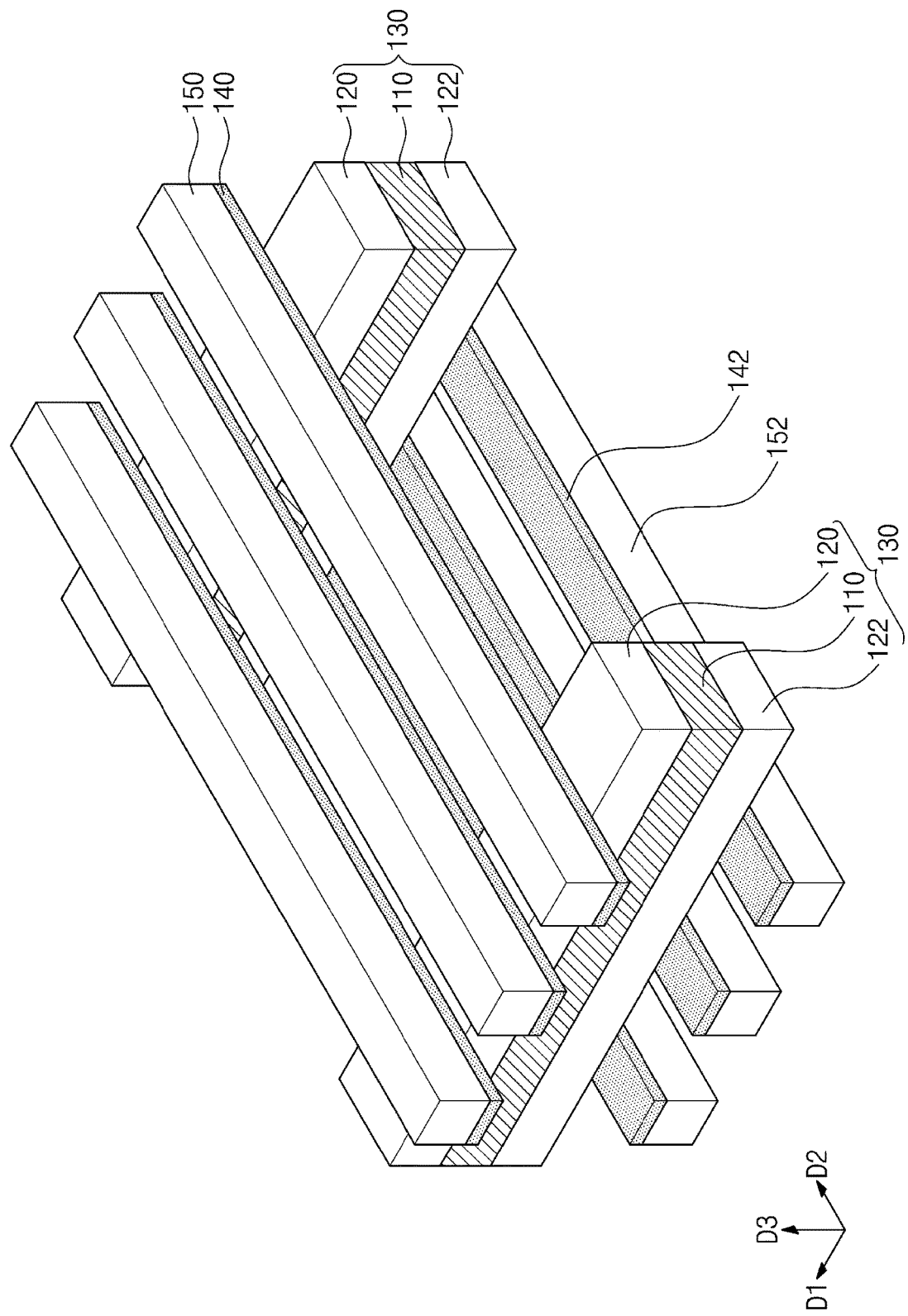
FIG. 19 illustrates a simplified perspective view showing a magnetic memory device according to some example embodiments of the present inventive concepts.

FIG. 19 illustrates a simplified perspective view showing a magnetic memory device according to some example embodiments of the present inventive concepts. The following will mainly explain differences from the magnetic memory device discussed above with reference to FIG. 11.

Referring to FIG. 19, the conductive line 110, the first magnetic pattern 120, and the third magnetic pattern 122 may constitute a read/write structure 130. In some embodiments, the read/write structure 130 may be provided in plural. The plurality of read/write structures 130 may be disposed between the plurality of second magnetic patterns 150 and the plurality of fourth magnetic patterns 152, and may be spaced apart from each other in the second direction D2. The plurality of second magnetic patterns 150 and the plurality of fourth magnetic patterns 152 may be connected in common to the plurality of read/write structures 130. The plurality of read/write structures 130 may run across the plurality of second magnetic patterns 150, and the first magnetic pattern 120 of each of the plurality of read/write structures 130 may be connected in common to the plurality of second magnetic patterns 150. The plurality of read/write structures 130 may run across the plurality of fourth magnetic patterns 152, and the third magnetic pattern 122 of each of the plurality of read/write structures 130 may be connected in common to the plurality of fourth magnetic patterns 152.

Figure 20:
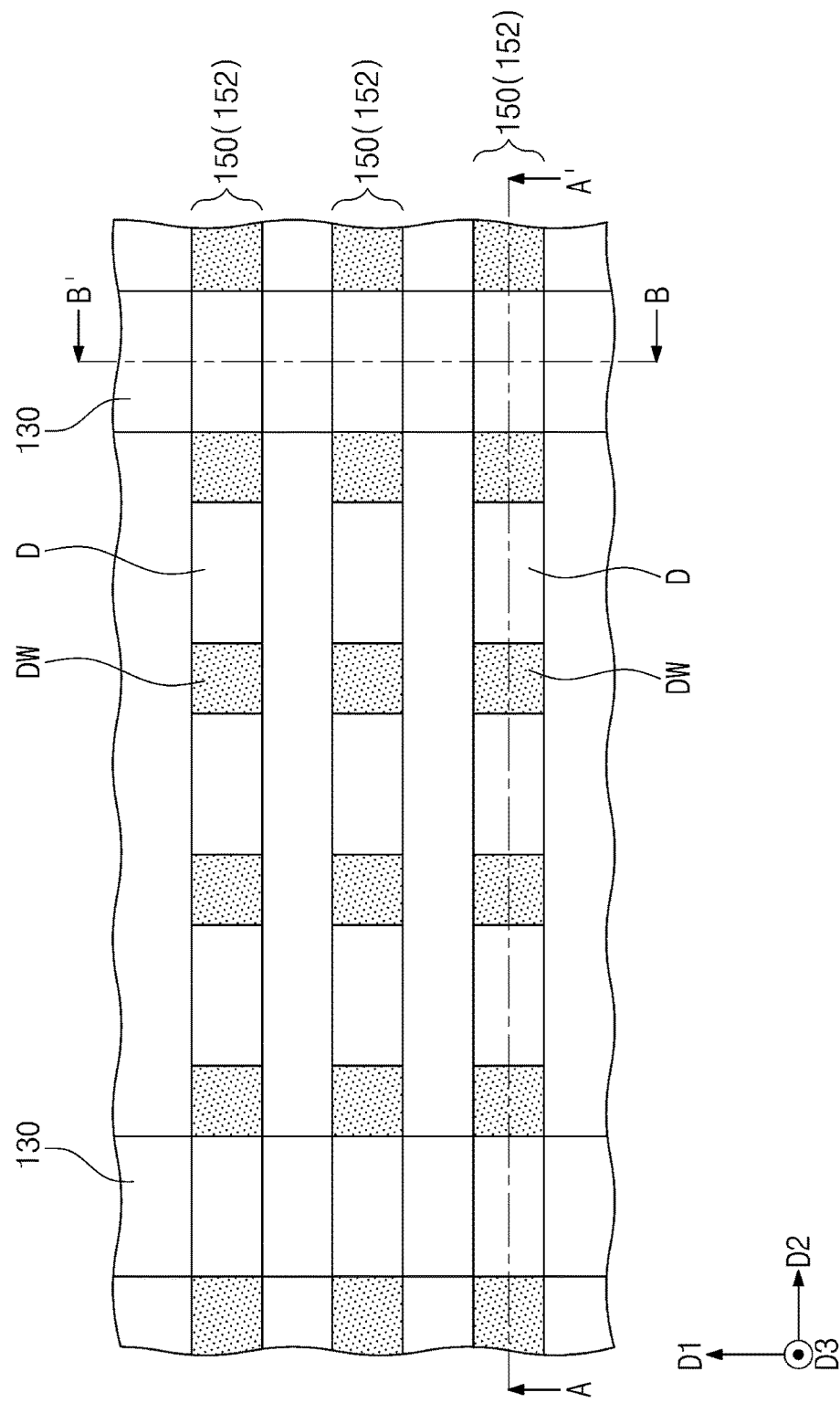
FIG. 20 illustrates a plan view showing a magnetic memory device according to some example embodiments of the present inventive concepts.
Figure 21A:
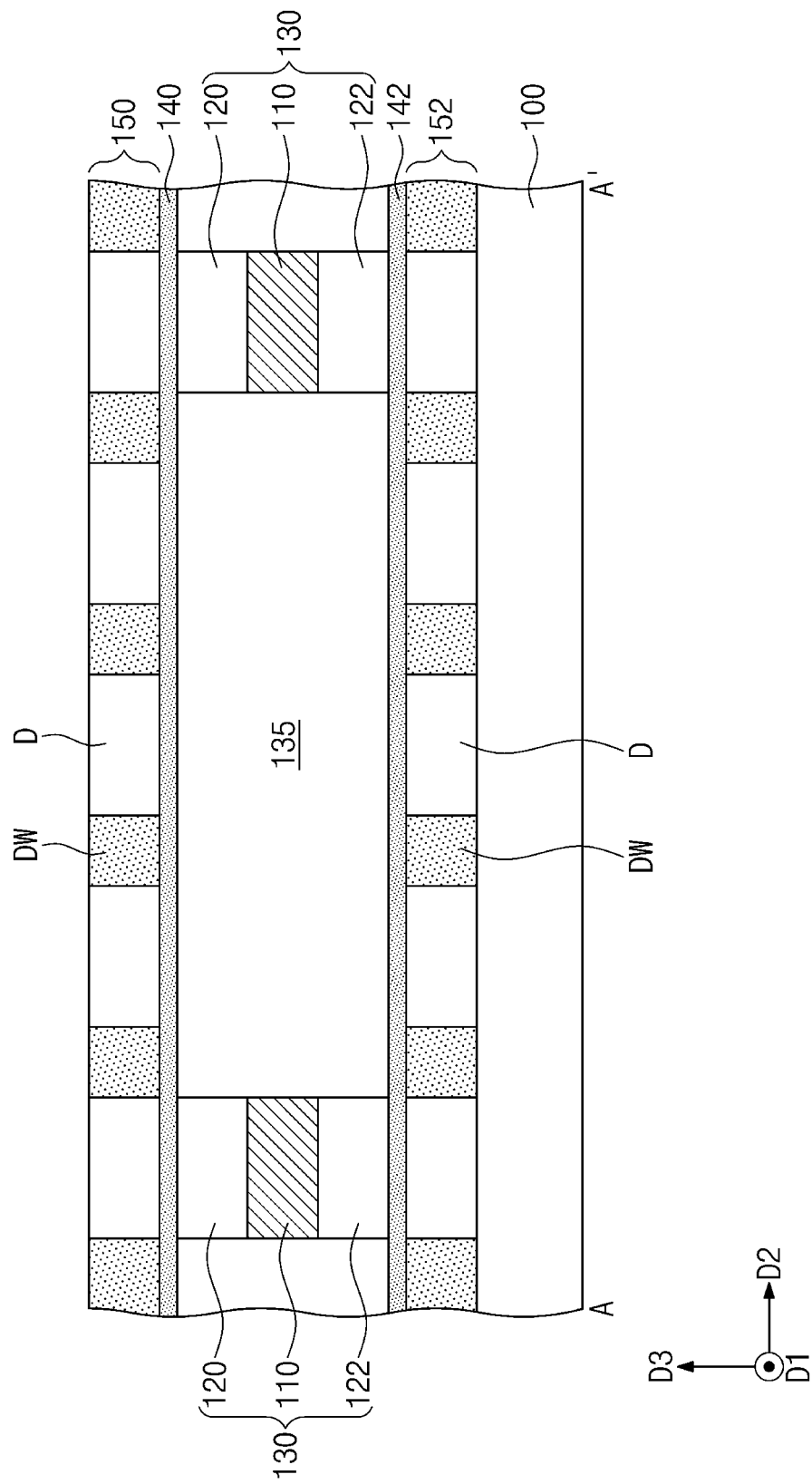
FIG. 21A illustrates a cross-sectional view taken along line A-A' of FIG. 20.
Figure 21B:
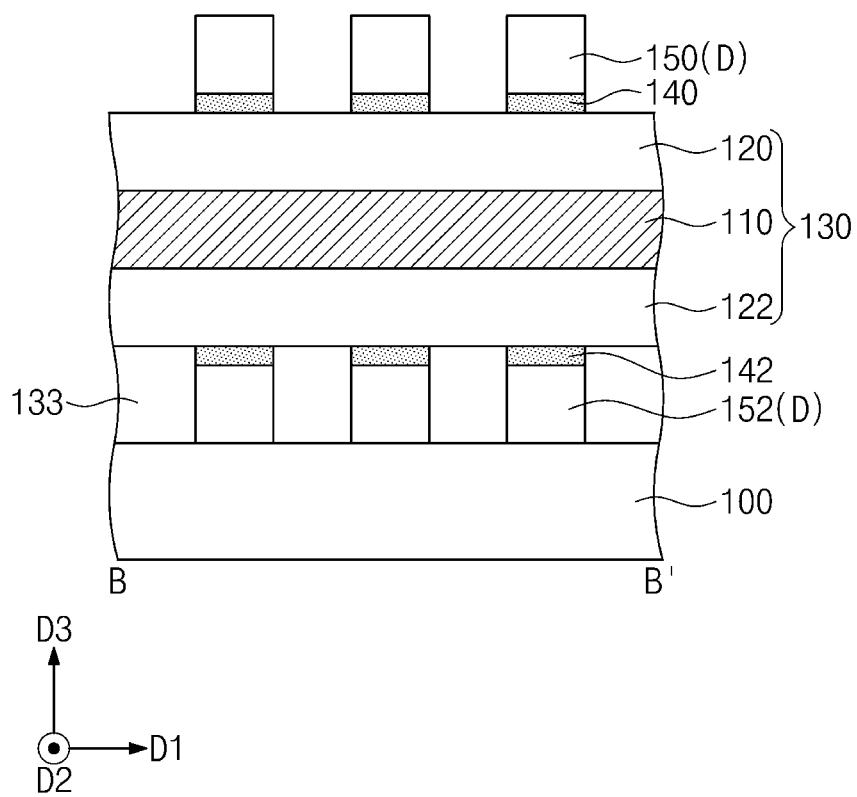
FIG. 21B illustrates a cross-sectional view taken along line B-B' of FIG. 20.

FIG. 20 illustrates a plan view showing a magnetic memory device according to some example embodiments of the present inventive concepts. FIG. 21A illustrates a cross-sectional view taken along line A-A' of FIG. 20. FIG. 21B illustrates a cross-sectional view taken along line B-B' of FIG. 20. The following will mainly describe differences from the magnetic memory device discussed above with reference to FIGS. 12, 13A, and 13B.

Referring to FIGS. 20, 21A, and 21B, the conductive line 110, the first magnetic pattern 120, and the third magnetic pattern 122 may constitute a read/write structure 130, and a plurality of read/write structures 130 may be disposed in the upper interlayer dielectric layer 135. The plurality of read/write structures 130 may be spaced apart from each other in the second direction D2 in the upper interlayer dielectric layer 135. The plurality of read/write structures 130 may be located at a height (or level) between the plurality of second magnetic patterns 150 and the plurality of fourth magnetic patterns 152. The plurality of read/write structures 130 may run across the plurality of second magnetic patterns 150, and the first magnetic pattern 120 of each of the plurality of read/write structures 130 may be connected in common to the plurality of second magnetic patterns 150. The plurality of read/write structures 130 may run across the plurality of fourth magnetic patterns 152, and the third magnetic pattern 122 of each of the plurality of read/write structures 130 may be connected in common to the plurality of fourth magnetic patterns 152. Each of the plurality of read/write structures 130 may be connected in common to corresponding portions of the plurality of second magnetic patterns 150 and also to corresponding portions of the plurality of fourth magnetic patterns 152.

Figure 22A:
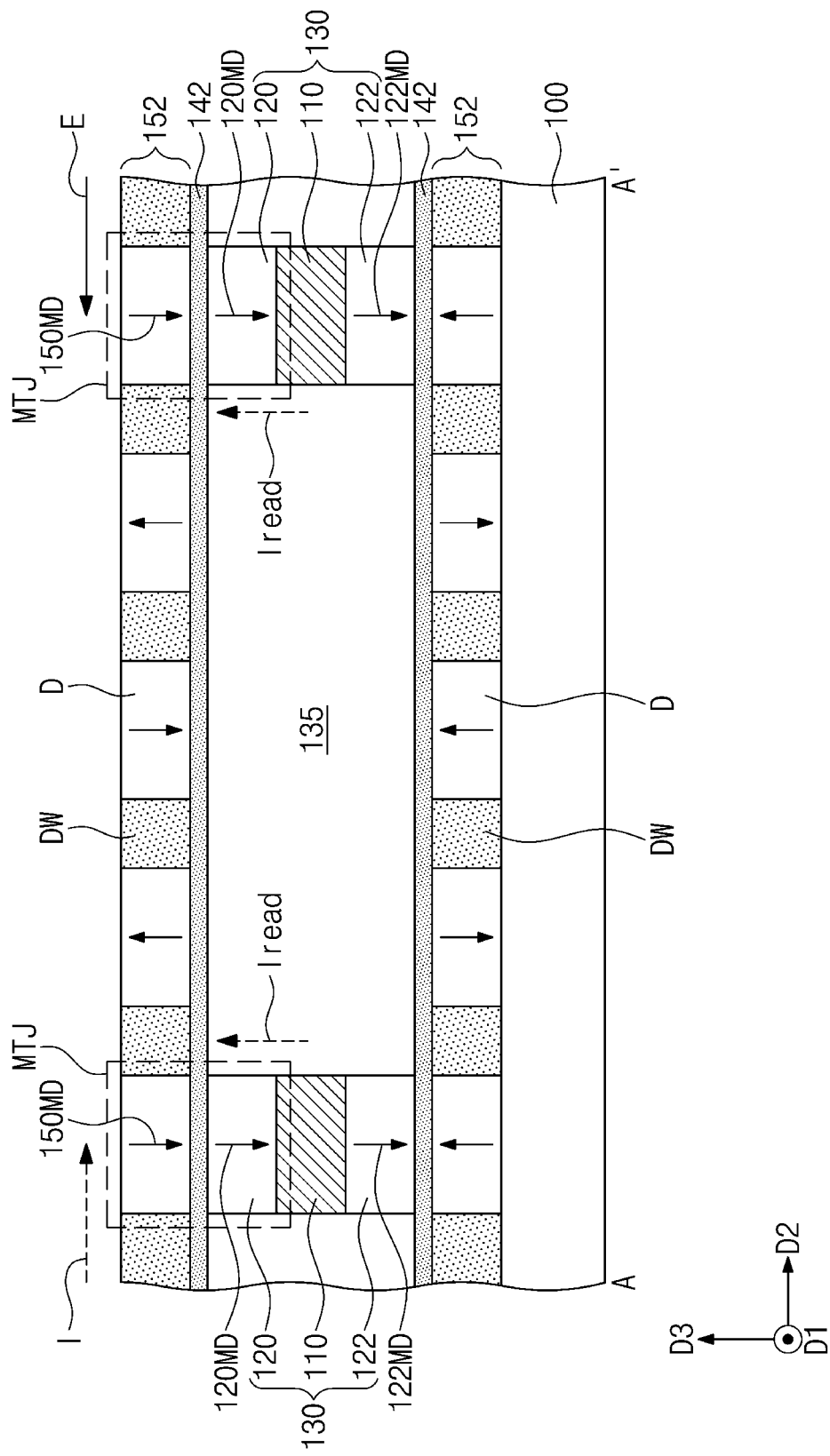
FIGS. 22A and 22B illustrate conceptual views showing a read operation of a magnetic memory device according to some example embodiments of the present inventive concepts.
Figure 22B:
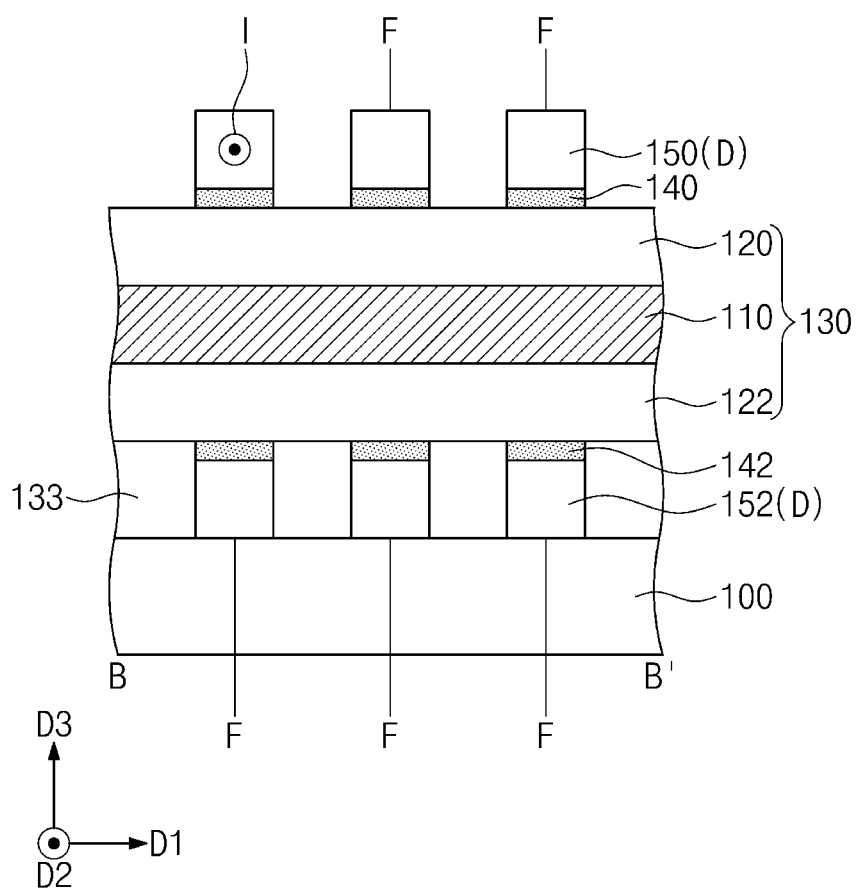

FIGS. 22A and 22B illustrate conceptual views showing a read operation of a magnetic memory device according to some example embodiments of the present inventive concepts. FIG. 22A illustrates a cross-sectional view taken along line A-A' of FIG. 20. FIG. 22B illustrates a cross-sectional view taken along line B-B' of FIG. 20. The following will describe differences from the read operation of the magnetic memory device discussed above with reference to FIGS. 14A and 14B.

Referring to FIGS. 20, 22A, and 22B, a current I to move the magnetic domain walls DW may flow through one of the plurality of second magnetic patterns 150. The rest of the plurality of second magnetic patterns 150 and the plurality of fourth magnetic patterns 152 may be held in an electrical floating state F. For example, in the one of the plurality of second magnetic patterns 150, the current I may flow in the second direction D2, and the magnetic domain walls DW may move in a direction (e.g., a moving direction of electrons E) opposite to the second direction D2. When the current I flows through the one of the plurality of second magnetic patterns 150, the motion of the magnetic domain walls DW may allow corresponding magnetic domains D to align with the plurality of read/write structures 130. The first magnetic patterns 120 of the plurality of read/write structures 130 and the corresponding magnetic domains D may constitute magnetic tunnel junctions MTJ.

A read current Iread may flow through the plurality of read/write structures 130. The read current Iread may be provided simultaneously or sequentially. The read current Iread may detect resistance states of the magnetic tunnel junctions MTJ. A data (e.g., a logic state of 1 or 0) stored in the corresponding magnetic domains D may be detected from the resistance states of the magnetic tunnel junctions MTJ. In some embodiments of the present inventive concepts, the read operation may be sequentially and individually performed on the plurality of second magnetic patterns 150 and the plurality of fourth magnetic patterns 152. Moreover, in one of the second and fourth magnetic patterns 150 and 152, the plurality of read/write structures 130 may be used to simultaneously perform read operations on different magnetic domains D.

Figure 23A:
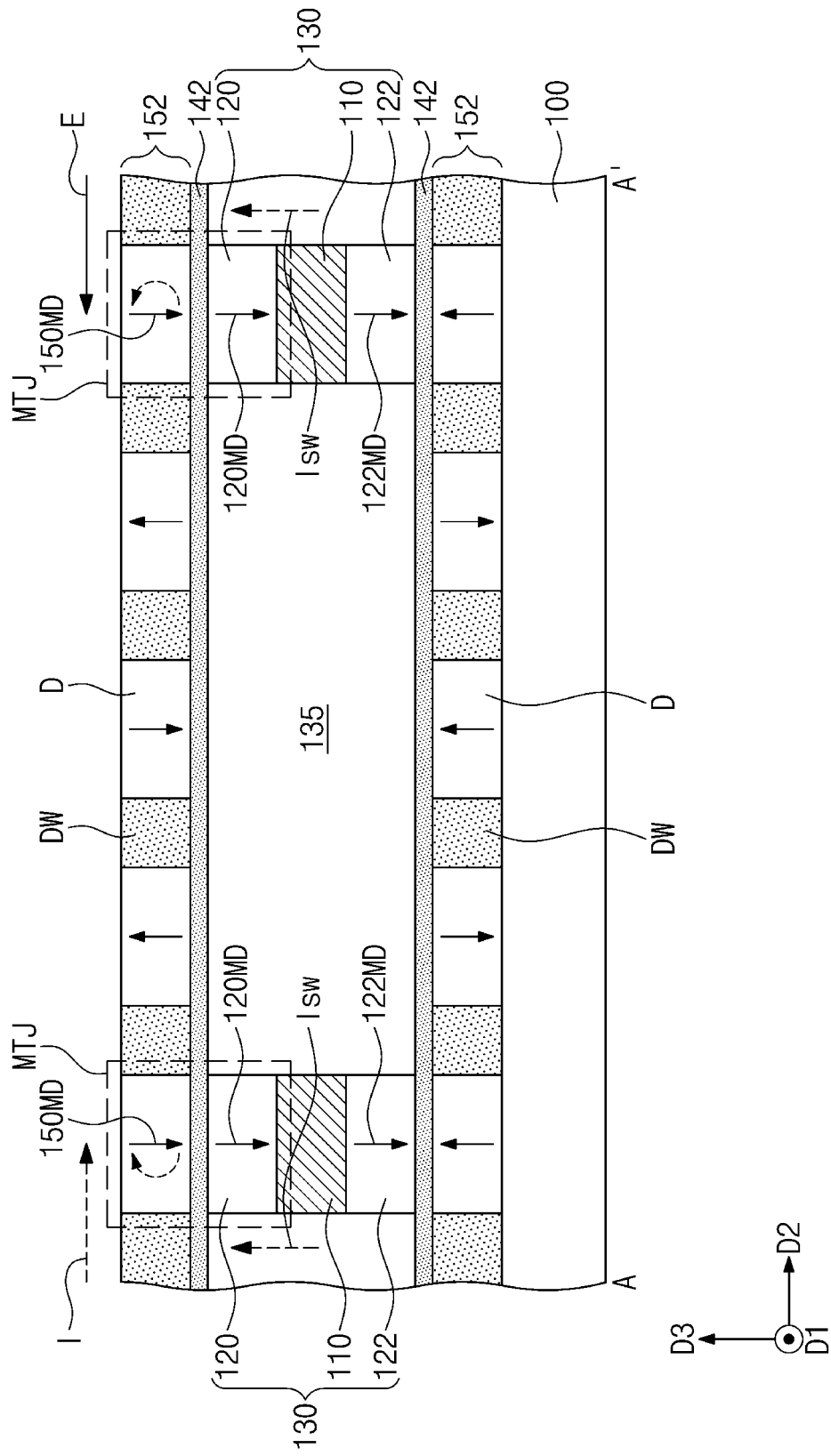
FIGS. 23A and 23B illustrate conceptual views showing a write operation of a magnetic memory device according to some example embodiments of the present inventive concepts.
Figure 23B:
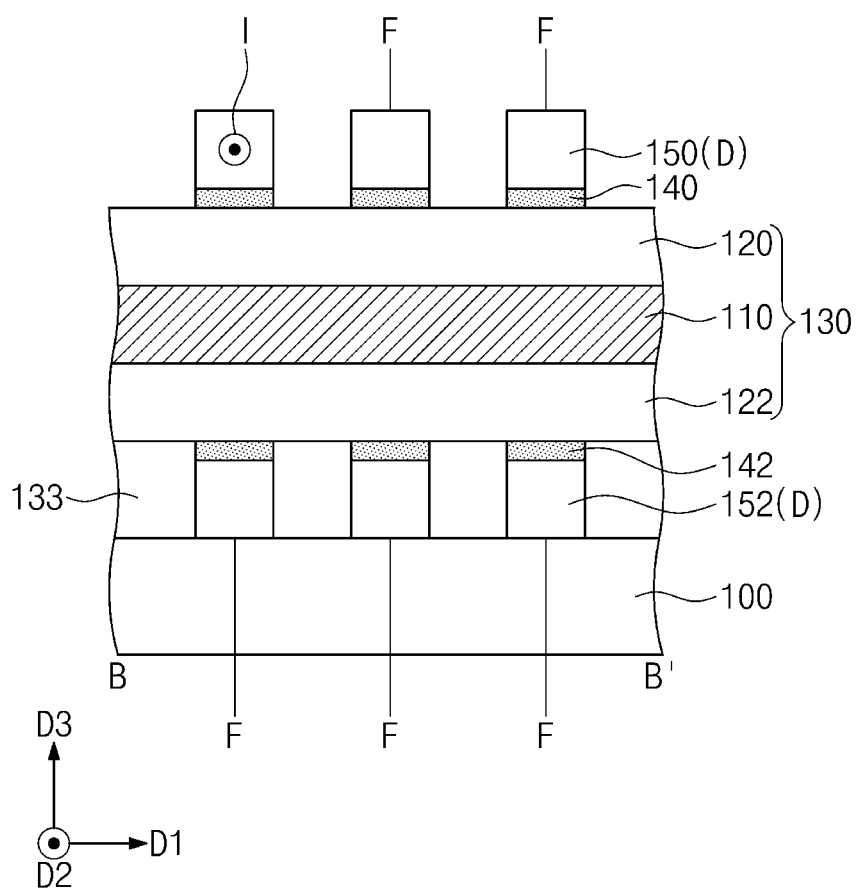

FIGS. 23A and 23B illustrate conceptual views showing a write operation of a magnetic memory device according to some example embodiments of the present inventive concepts. FIG. 23A illustrates a cross-sectional view taken along line A-A' of FIG. 20. FIG. 23B illustrates a cross-sectional view taken along line B-B' of FIG. 20. The following will describe differences from the write operation of the magnetic memory device discussed above with reference to FIGS. 15A and 15B.

Referring to FIGS. 20, 23A, and 23B, the current I to move the magnetic domain walls DW may flow through one of the plurality of second magnetic patterns 150. The rest of the plurality of second magnetic patterns 150 and the plurality of fourth magnetic patterns 152 may be held in an electrical floating state F. When the current I flows through the one of the plurality of second magnetic patterns 150, the motion of the magnetic domain walls DW may allow corresponding magnetic domains D to align with the plurality of read/write structures 130. The first magnetic patterns 120 of the plurality of read/write structures 130 and the corresponding magnetic domains D may constitute magnetic tunnel junctions MTJ.

A write current Isw may flow through the plurality of read/write structures 130. The write current Isw may be provided simultaneously or sequentially. The write current Isw may have a magnitude greater than that of the read current Tread. A spin transfer torque caused by the write current Isw may reverse the magnetization directions 150MD of the corresponding magnetic domains D in the magnetization tunnel junctions MTJ. Owing to the spin transfer torque caused by the write current Isw, the magnetization direction 150MD of each of the corresponding magnetic domains D may be switched parallel or antiparallel to the magnetization direction 120MD of the first magnetic pattern 120. In some embodiments of the present inventive concepts, the write operation may be sequentially and individually performed on the plurality of second magnetic patterns 150 and the plurality of fourth magnetic patterns 152. Moreover, in one of the second and fourth magnetic patterns 150 and 152, the plurality of read/write structures 130 may be used to simultaneously perform read operations on different magnetic domains D.

According to the present inventive concepts, a first magnetic pattern may run across a plurality of second magnetic patterns and also may be connected in common to the plurality of second magnetic patterns. In this case, the first magnetic pattern and its underlying conductive line may be formed by using a single photomask, and no additional photomask may be required to form the first magnetic pattern. Therefore, it may be possible to reduce the number of photomasks used for fabricating a magnetic memory device. Furthermore, because the plurality of second magnetic patterns are formed to run across the first magnetic pattern, an easy alignment may be established between the first magnetic pattern and the plurality of second magnetic patterns. Thus, a process margin may decrease in forming the second magnetic patterns. As a result, the magnetic memory device may be easily mass-fabricated and highly integrated.

The aforementioned description provides some example embodiments for explaining the present inventive concepts. Therefore, the present inventive concepts are not limited to the embodiments described above, and it will be understood by one of ordinary skill in the art that variations in form and detail may be made therein without departing from the scope of the present inventive concepts.

What is claimed is:
1. A magnetic memory device comprising:
   a first magnetic pattern that extends in a first direction and has a magnetization direction fixed in one direction; and
   a plurality of second magnetic patterns that extend across the first magnetic pattern,
   wherein the plurality of second magnetic patterns extend in a second direction intersecting the first direction and are spaced apart from each other in the first direction,
   wherein each of the plurality of second magnetic patterns includes a plurality of magnetic domains that are spaced apart from each other in the second direction, wherein each of the plurality of second magnetic patterns overlaps the first magnetic pattern in a third direction that is perpendicular to the first and second directions, and wherein the first magnetic pattern is electrically connected to each of the plurality of second magnetic patterns.

2. The magnetic memory device of claim 1, further comprising a plurality of tunnel barrier patterns that extend across the first magnetic pattern, wherein each of the plurality of tunnel barrier patterns is between the first magnetic pattern and a respective one of the plurality of second magnetic patterns.

3. The magnetic memory device of claim 2, wherein the plurality of tunnel barrier patterns extend in the second direction and are spaced apart from each other in the first direction.

4. The magnetic memory device of claim 1, further comprising a conductive line that extends in the first direction and is electrically connected to the first magnetic pattern, wherein the first magnetic pattern is between the conductive line and the plurality of second magnetic patterns, and wherein the conductive line is longer in the first direction than each of the plurality of second magnetic patterns.

5. The magnetic memory device of claim 4, further comprising a third magnetic pattern that extends in the first direction and has a magnetization direction fixed in one direction, wherein the conductive line is between the first magnetic pattern and the third magnetic pattern.

6. The magnetic memory device of claim 5, wherein the first magnetic pattern, the conductive line, and the third magnetic pattern overlap each other along the third direction.

7. The magnetic memory device of claim 5, further comprising a plurality of fourth magnetic patterns that extend across the third magnetic pattern, wherein the third magnetic pattern is between the conductive line and the plurality of fourth magnetic patterns.

8. The magnetic memory device of claim 7, wherein the third magnetic pattern is electrically connected to each of the plurality of fourth magnetic patterns.

9. The magnetic memory device of claim 1, further comprising a tunnel barrier pattern between the first magnetic pattern and one of the plurality of second magnetic patterns, wherein the magnetization direction of the first magnetic pattern and a magnetization direction of each of the magnetic domains are perpendicular to an interface between the tunnel barrier pattern and the first magnetic pattern.

10. The magnetic memory device of claim 1, further comprising a tunnel barrier pattern between the first magnetic pattern and one of the plurality of second magnetic patterns, wherein the magnetization direction of the first magnetic pattern and a magnetization direction of each of the magnetic domains are parallel to an interface between the tunnel barrier pattern and the first magnetic pattern.

11. A magnetic memory device comprising:

a conductive line that extends in a first direction on a substrate, the first direction being parallel to an upper surface of the substrate;

a first magnetic pattern that is on the conductive line and extends in the first direction; and a plurality of second magnetic patterns that are on the first magnetic pattern and extend across the first magnetic pattern, wherein the plurality of second magnetic patterns extend in a second direction parallel to the upper surface of the substrate and intersecting the first direction, and the plurality of second magnetic patterns are spaced apart from each other in the first direction, and wherein each of the plurality of second magnetic patterns includes a plurality of magnetic domains that are spaced apart from each other in the second direction.

12. The magnetic memory device of claim 11, wherein the first magnetic pattern extends from a first location between the conductive line and one of the plurality of second magnetic patterns to a second location between the conductive line and another of the plurality of second magnetic patterns.

13. The magnetic memory device of claim 11, further comprising a plurality of tunnel barrier patterns that are on the first magnetic pattern and extend across the first magnetic pattern, wherein the plurality of tunnel barrier patterns extend in the second direction and are spaced apart from each other in the first direction, and wherein each of the plurality of tunnel barrier patterns is between the first magnetic pattern and a respective one of the plurality of second magnetic patterns.

14. The magnetic memory device of claim 13, further comprising an interlayer dielectric layer on the substrate and on a lateral surface of the conductive line and a lateral surface of the first magnetic pattern, wherein the plurality of second magnetic patterns and the plurality of tunnel barrier patterns are on the interlayer dielectric layer.

15. The magnetic memory device of claim 11, wherein the first magnetic pattern has a magnetization direction fixed in one direction, and wherein each of the magnetic domains has a magnetization direction that is switchable between being oriented parallel or antiparallel to the magnetization direction of the first magnetic pattern.

16. A magnetic memory device comprising:

a first magnetic pattern that extends in a first direction; and a plurality of second magnetic patterns that extend across the first magnetic pattern in a second direction intersecting the first direction, wherein each of the plurality of second magnetic patterns includes a plurality of magnetic domains that are spaced apart from each other in the second direction, wherein each of the plurality of second magnetic patterns overlaps the first magnetic pattern in a third direction that is perpendicular to the first and second directions, and wherein the first magnetic pattern extends across and is electrically connected to each of the plurality of second magnetic patterns.

17. The magnetic memory device of claim 16, wherein the plurality of second magnetic patterns extend in the second direction and are spaced apart from each other in the first direction.

18. The magnetic memory device of claim 17, wherein the plurality of magnetic domains are spaced apart from each other in the second direction in each of the plurality of second magnetic patterns, wherein one of the plurality of magnetic domains in a first of the plurality of second magnetic patterns overlaps the first magnetic pattern in the third direction, wherein one of the plurality of magnetic domains in a second of the plurality of second magnetic patterns overlaps the first magnetic pattern in the third direction, and wherein one of the plurality of magnetic domains in a third of the plurality of second magnetic patterns overlaps the first magnetic pattern in the third direction.

19. The magnetic memory device of claim 16, further comprising a conductive line that is vertically overlapped by the first magnetic pattern, wherein the first magnetic pattern is between the conductive line and the plurality of second magnetic patterns, and wherein the conductive line extends across each of the plurality of second magnetic patterns.

20. The magnetic memory device of claim 16, wherein the plurality of second magnetic patterns have horizontal gaps therebetween.

* * * * *